United States Patent
Shih et al.

(10) Patent No.: US 11,647,623 B2
(45) Date of Patent: May 9, 2023

(54) METHOD FOR MANUFACTURING SEMICONDUCTOR STRUCTURE WITH BURIED POWER LINE AND BURIED SIGNAL LINE

(71) Applicant: NANYA TECHNOLOGY CORPORATION, New Taipei (TW)

(72) Inventors: Chiang-Lin Shih, New Taipei (TW); Tseng-Fu Lu, New Taipei (TW); Jeng-Ping Lin, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 61 days.

(21) Appl. No.: 17/524,917

(22) Filed: Nov. 12, 2021

(65) Prior Publication Data

US 2022/0077148 A1    Mar. 10, 2022

Related U.S. Application Data

(62) Division of application No. 17/014,282, filed on Sep. 8, 2020, now Pat. No. 11,315,928.

(51) Int. Cl.
*H01L 21/74*    (2006.01)
*H01L 23/535*    (2006.01)
*H10B 12/00*    (2023.01)

(52) U.S. Cl.
CPC ........... *H10B 12/20* (2023.02); *H01L 21/743* (2013.01); *H01L 23/535* (2013.01)

(58) Field of Classification Search
CPC ............. H01L 27/10802; H01L 21/743; H01L 23/535; H01L 23/5286; H01L 27/1085;

(Continued)

(56) References Cited

U.S. PATENT DOCUMENTS 6,433,381 B2 *   8/2002   Mizutani ........... H01L 21/76807
                                                257/E21.507
7,462,912 B2 *   12/2008  Ahn ..................... H01L 27/0207
                                                257/334

(Continued)

FOREIGN PATENT DOCUMENTS

TW    201248863 A    12/2012
TW    201703264 A    1/2017

OTHER PUBLICATIONS

Notice of Allowance dated Mar. 24, 2022 related to Taiwanese Application No. 110125918.

(Continued)

*Primary Examiner* — Duy T Nguyen
(74) *Attorney, Agent, or Firm* — Xuan Zhang

(57) ABSTRACT

The present disclosure provides a method for manufacturing a semiconductor structure. The method includes providing a substrate having a first top surface; forming an isolation region in the substrate to surround an active region; forming a recess in the active region; disposing a first conductive material within the recess to form a buried power line and a buried signal line; forming a first circuit layer and a second circuit layer on the first top surface of the substrate, wherein the first circuit layer covers the buried power line and the buried signal line, and the second circuit layer is separated from the first circuit layer; and forming a cell capacitor over the first circuit layer.

8 Claims, 23 Drawing Sheets

(58) Field of Classification Search
CPC ......... H01L 27/10885; H01L 27/10891; H01L 27/10811; H01L 27/1082; H10B 12/20; H10B 12/03; H10B 12/482; H10B 12/488; H10B 12/312; H10B 12/33
USPC ........................................................ 438/210
See application file for complete search history.

(56) References Cited

U.S. PATENT DOCUMENTS

| | | | |
|---|---|---|---|
| 8,853,762 B2 * | 10/2014 | Tu | H01L 28/60 257/E27.092 |
| 2002/0192902 A1 * | 12/2002 | Kimura | H01L 27/10882 257/E21.018 |
| 2010/0001331 A1 * | 1/2010 | Mikasa | H01L 27/10888 257/773 |
| 2012/0231619 A1 * | 9/2012 | Park | H01L 27/10894 438/585 |
| 2013/0285203 A1 * | 10/2013 | Hiroi | H01L 27/10894 257/532 |
| 2021/0118886 A1 * | 4/2021 | Choi | G11C 5/063 |

OTHER PUBLICATIONS

Translation of Notice of Allowance dated Mar. 24, 2022 related to Taiwanese Application No. 110125918.

* cited by examiner

METHOD FOR MANUFACTURING SEMICONDUCTOR STRUCTURE WITH BURIED POWER LINE AND BURIED SIGNAL LINE

CROSS-REFERENCE TO RELATED APPLICATION

This application is a divisional application of U.S. Non-Provisional application Ser. No. 17/014,282 filed on Sep. 8, 2020, which is incorporated herein by reference in its entirety.

TECHNICAL FIELD

The present disclosure relates to a method for manufacturing a semiconductor structure, and more particularly, to a method for manufacturing a semiconductor structure with a buried power line and a buried signal line.

DISCUSSION OF THE BACKGROUND

A dynamic random access memory (DRAM) is a type of semiconductor arrangement for storing bits of data in separate cell capacitors within an integrated circuit. DRAMs commonly take the form of trench capacitor DRAM cells and stacked capacitor DRAM cells. In the stack capacitor DRAM cells, the cell capacitors are formed above read/write transistors. An advanced method of fabricating the read/write transistors uses a buried gate electrode, which involves a gate electrode and a word line being built in a gate trench in an active region.

Over the past few decades, as semiconductor fabrication technology has continued to improve, sizes of electronic devices are correspondingly reduced. As the size of a cell transistor is reduced to a few nanometers in length, short-channel effects may occur, which may result in a significant drop in the performance of the cell transistors.

To overcome the performance issue, there is a significant need to improve the fabrication method of cell transistors in a semiconductor structure.

This Discussion of the Background section is provided for background information only. The statements in this Discussion of the Background are not an admission that the subject matter disclosed in this Discussion of the Background section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure. The semiconductor structure comprises a substrate having a first top surface. An active region is surrounded by an isolation region in the substrate. A buried power line and a buried signal line are disposed within the substrate and in the active region. A first circuit layer is disposed on the first top surface of the substrate to cover the buried power line and the buried signal line. A second circuit layer is disposed on the first top surface of the substrate and separated from the first circuit layer. A cell capacitor is disposed on and electrically coupled to the first circuit layer.

In some embodiments, the buried power line is disposed at a central portion of the active region, and the buried signal line is disposed at a peripheral portion of the active region.

In some embodiments, the buried power line is distal to the isolation region, and the buried signal line is proximal to the isolation region.

In some embodiments, the semiconductor structure further comprises a word line structure disposed over the cell capacitor.

In some embodiments, the semiconductor structure further comprises an interlayer dielectric encapsulating the cell capacitor and the word line structure.

In some embodiments, the semiconductor structure further comprises a second conductive material within a through hole penetrating the interlayer dielectric.

In some embodiments, the semiconductor structure further comprises a bit line structure disposed on the interlayer dielectric and over the word line structure.

In some embodiments, the buried power line, the buried signal line and the word line structure extend along a first direction, and the bit line structure extends along a second direction substantially orthogonal to the first direction.

In some embodiments, the second conductive material in the through hole extends along a third direction substantially orthogonal to the first direction and the second direction.

In some embodiments, the buried power line and the buried signal line are arranged along the second direction.

In some embodiments, the word line structure and the bit line structure form a memory array, wherein the memory array has a layout of four square feature size ($4F^2$).

In some embodiments, the cell capacitor is interposed between the first circuit layer and the word line structure, and the word line structure is interposed between the cell capacitor and the bit line structure.

Another aspect of the present disclosure provides a method of fabricating a semiconductor structure. The method comprises providing a substrate having a first top surface; forming an isolation region in the substrate to surround an active region; forming a recess in the active region; disposing a first conductive material within the recess to form a buried power line and a buried signal line; forming a first circuit layer and a second circuit layer on the first top surface of the substrate, wherein the first circuit layer covers the buried power line and the buried signal line, and the second circuit layer is separated from the first circuit layer; and forming a cell capacitor over the first circuit layer.

In some embodiments, the method further comprises forming a word line structure over the cell capacitor; and forming an interlayer dielectric to encapsulate the cell capacitor and the word line structure.

In some embodiments, after the formation of the interlayer dielectric, a through hole is formed to penetrate the interlayer dielectric and partially expose the second circuit layer.

In some embodiments, after the formation of the through hole, a second conductive material is deposited to fill the through hole.

In some embodiments, after the formation of the second conductive material, a bit line structure is formed on the interlayer dielectric and over the word line structure.

In some embodiments, the bit line structure is electrically coupled to the word line structure and the cell capacitor.

In some embodiments, the bit line structure is electrically coupled to the word line structure, the cell capacitor and the first circuit layer.

In some embodiments, the second conductive material electrically connects the bit line structure to the second circuit layer.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1B:
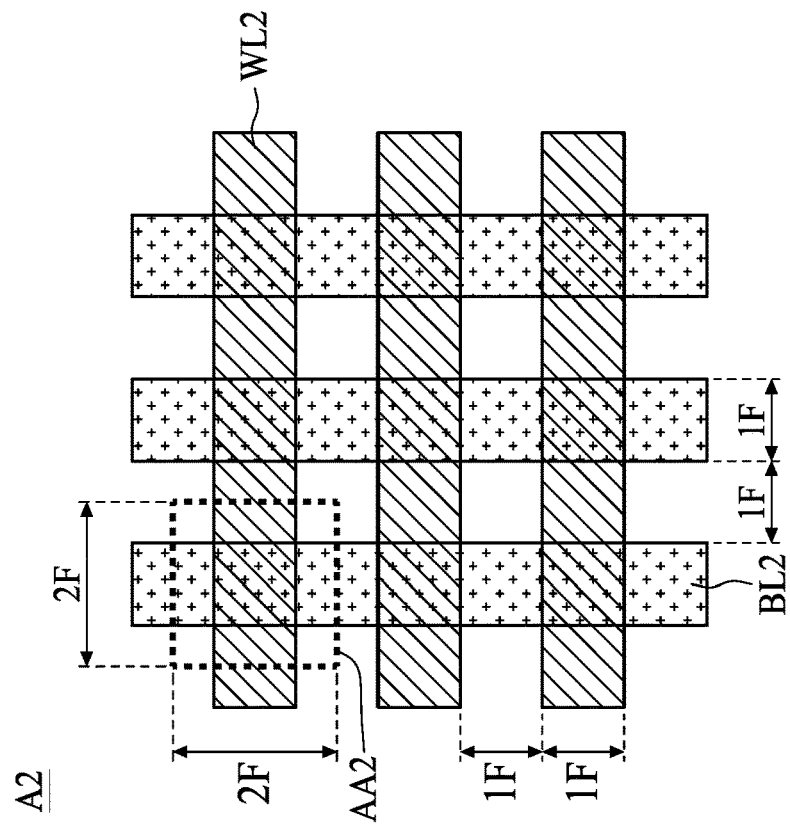
FIG. 1B is a schematic top plan view of a portion of a second memory array with a $4F^2$ layout, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In silicon on insulator (SOI) technology, a floating body effect (FBE) is a phenomenon in which a threshold voltage ($V_{th}$) of a transistor varies because a body of the transistor does not have a certain fixed voltage value during operation. In other words, the threshold voltage of the transistor depends on the history of its biasing and carrier recombination processes. The floating body effect causes voltage fluctuation in a body region of a SOI metal oxide semiconductor field effect transistor (MOSFET), which results in detrimental effects on operation of SOI devices. The most common of these detrimental effects are kink effect and bipolar effect. With a channel region of the device partially depleted and a high drain voltage applied, an electric field created in the device causes impact ionization near a drain region.

Dynamic random access memory (DRAM) has been developed to overcome the inherent scaling limitations and to improve the cost effectiveness of mass production. Scaling down of the DRAM has been remarkably advanced by the adoption of a trench capacitor structure and a stacked capacitor structure. A size of a unit memory cell with one cell transistor and one cell capacitor has been reduced by evolution of a layout of a memory array from a six square feature size ($6F^2$) to a four square feature size ($4F^2$). Specifically, the minimum feature size F decreases with a new generation, and when the cell size is generally taken to be $\alpha F^2$, $\alpha$ is a coefficient that also decreases with the advance of generation.

The main difference between the $6F^2$ and $4F^2$ layouts is that the $4F^2$ cell structure is implemented using a vertical pillar transistor (VPT), while the $6F^2$ cell structure is implemented using a buried-channel-array transistor (BCAT). The $4F^2$ cell is a promising architecture for cost-effective and scalable DRAM chips because of its minimized area of cells. Due to the VPT design, the $4F^2$ cell can be implemented in an area that is 33% smaller than that of the $6F^2$ cell; thus, the area of a memory cell array is reduced. The VPT device demonstrates excellent retention characteristics in static mode. The floating body effect can be reduced by adopting the gradual junction profile even in a pillar-type channel.

To avoid the floating body effect and to decrease the current leakage in transistors for low-power applications, non-silicon based materials show high potential when used in the $4F^2$ cell structure because of their intrinsically high band gap. However, high-temperature processes might impact electrical properties of the non-silicon based materials. For example, many non-silicon based materials are heat sensitive and may be degraded by the high-temperature processes. Fabrication of a cell capacitor generally includes several high-temperature processes.

Therefore, when the heat-sensitive non-silicon based materials are used in the fabrication of cell transistors, processes of the cell capacitor and the cell transistor should be separated and a capacitor-first process should be adopted. However, practical use is not easy since there is technical difficulty in that in $4F^2$ DRAMs the cell transistor must be a vertical type. It is very difficult to decrease the area of the cell transistor and the cell capacitor. For example, metal routing of power lines and signal lines is challenging because of limited space. Additional metal routing should be designed in additional contact areas.

In capacitor-first processes for fabricating $4F^2$ DRAMs, the space originally designed for the metal routing is blocked by the cell capacitor. Therefore, in the present disclosure, the power lines and signal lines are buried in recesses formed in the same manner as gate trenches in the fabrication of $6F^2$ DRAMs.

Figure 1A:
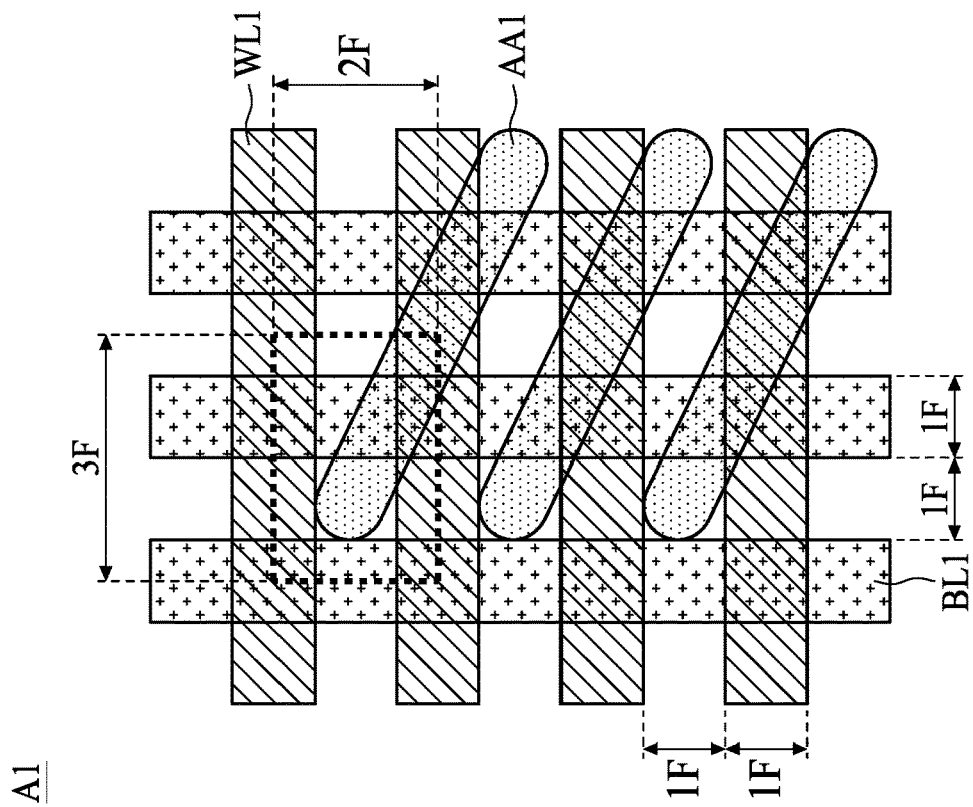
FIG. 1A is a schematic top plan view of a portion of a first memory array with a $6F^2$ layout, in accordance with some embodiments of the present disclosure.

FIG. 1A is a schematic top plan view of a portion of a first memory array A1 with a $6F^2$ layout, in accordance with some embodiments of the present disclosure. In FIG. 1A, multiple word lines WL1 are orthogonal to multiple bit lines BL1. In some embodiments, a width of each word line WL1 and a width of each bit line BL1 are 1F, wherein the F is a minimum feature size. In some embodiments, a distance between any two adjacent word lines WL1 and a distance between any two adjacent bit lines BL1 are also 1F. In the $6F^2$ layout, an active region AA1 is diagonally disposed with respect to the extending direction of the word line WL1 or the bit line BL1. In the active region AA1, multiple memory cells (not shown) are located at the intersection of the word line WL1 and the bit line BL1 and electrically coupled to the word line WL1 and the bit line BL1. Therefore, the area of a unit memory cell in FIG. 1A is about $3F \times 2F = 6F^2$, as shown by the rectangular dashed line.

FIG. 1B is a schematic top plan view of a portion of a second memory array A2 with a $4F^2$ layout, in accordance with some embodiments of the present disclosure. In FIG. 1B, multiple word lines WL2 are orthogonal to multiple bit lines BL2. In some embodiments, a width of each word line WL2 and a width of each bit line BL2 are 1F. In some embodiments, a distance between any two adjacent word lines WL2 and a distance between any two adjacent bit lines BL2 are also 1F. In the $4F^2$ layout, an active region AA2 is disposed at the intersection of the word line WL2 and the bit line BL2. In addition, a unit memory cell (not shown) is located in the active region AA2 and electrically coupled to the word line WL2 and the bit line BL2. Therefore, the area of the unit memory cell in FIG. 1B is about $2F \times 2F = 4F^2$, as shown by the square dashed line.

Figure 2:
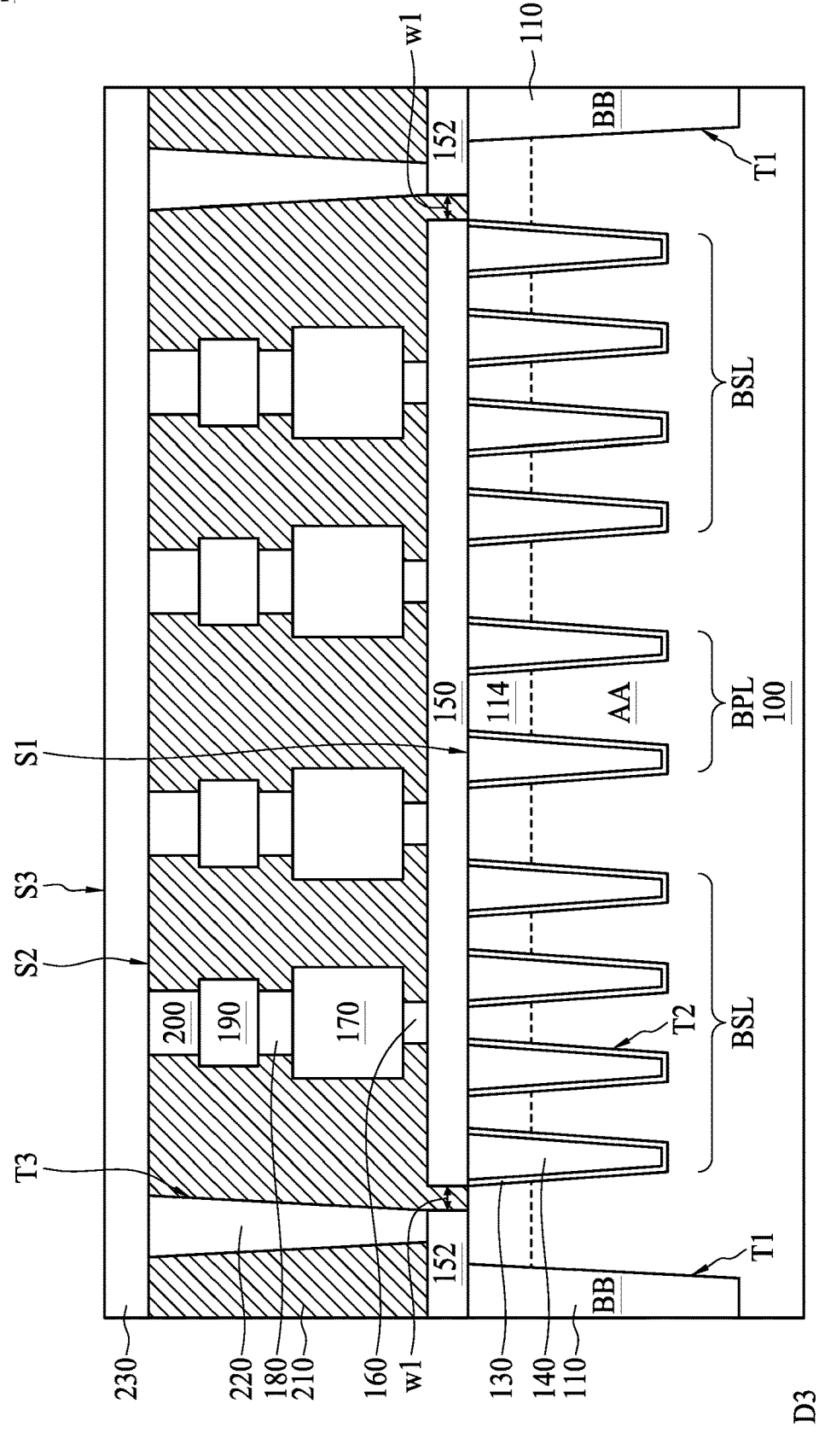
FIG. 2 is a schematic cross-sectional view of a semiconductor structure, in accordance with some embodiments of the present disclosure.

FIG. 2 is a schematic cross-sectional view of a semiconductor structure ST1, in accordance with some embodiments of the present disclosure. The semiconductor structure ST1 includes a substrate 100 having a first top surface S1. An isolation trench T1 is disposed in the substrate 100 and filled with a first dielectric material 110. The isolation trench T1 filled with the first dielectric material 110 forms an isolation region BB in the substrate 100. An active region AA is surrounded by the isolation region BB. The active region AA is doped to form an impurity region 114. A recess T2 is disposed in the active region AA, wherein the depth of the recess T2 is less than that of the isolation trench T1. The impurity region 114 is divided by multiple recesses T2 into multiple impurity regions 114.

An insulating liner 130 is conformally disposed within the recess T2. A first conductive material 140 is disposed within the recess T2 and surrounded by the insulating liner 130. The first conductive material 140 located at a central portion of the active region AA forms a buried power line BPL, and the first conductive material 140 located at a peripheral portion of the active region AA forms a buried signal line BSL. The buried power line BPL and the buried signal line BSL extend along a first direction D1. In addition, multiple buried power lines BPL and multiple buried signal lines BSL are arranged along a second direction D2 orthogonal to the first direction D1.

A first circuit layer 150 and a second circuit layer 152 are disposed on the first top surface S1 of the substrate 100 and separated from each other by a predetermined distance w1. The first circuit layer 150 covers the buried power lines BPL and the buried signal lines BSL and is electrically coupled to the buried power lines BPL and the buried signal lines BSL. The second circuit layer 152 does not cover the buried power lines BPL or the buried signal lines BSL.

A cell capacitor 170 is disposed on a landing pad 160 on the first circuit layer 150. The cell capacitor 170 is electrically coupled to the first circuit layer 150 via the landing pad 160. A word line structure 190 is disposed on a first conductive plug 180 disposed on the cell capacitor 170. The word line structure 190 is electrically coupled to the cell capacitor 170 via the first conductive plug 180. The cell capacitor 170 is interposed between the first circuit layer 150 and the word line structure 190. The word line structure 190 extends along the first direction D1. In some embodiments, multiple word line structures 190 are arranged along the second direction D2.

A second conductive plug 200 is disposed on the word line structure 190. The stack of the landing pad 160, the cell capacitor 170, the first conductive plug 180, the word line structure 190 and the second conductive plug 200 extends along a third direction D3 substantially orthogonal to both the first direction D1 and the second direction D2. An interlayer dielectric 210 having a second top surface S2 encapsulates the landing pad 160, the cell capacitor 170, the first conductive plug 180, the word line structure 190 and the second conductive plug 200.

A through hole T3 penetrates the interlayer dielectric 210 and exposes the second circuit layer 152. The through hole T3 is filled with a second conductive material 220. A bit line structure 230 is disposed over the word line structure 190. In addition, the word line structure 190 is interposed between the cell capacitor 170 and the bit line structure 230. The bit line structure 230 extends in the second direction D2. The second conductive material 220 deposited in the through hole T3 is substantially a bit line contact (BLC) electrically connecting the bit line structure 230 to the second circuit layer 152 and to the impurity region 114. The bit line contact extends in the third direction D3.

Figure 3:
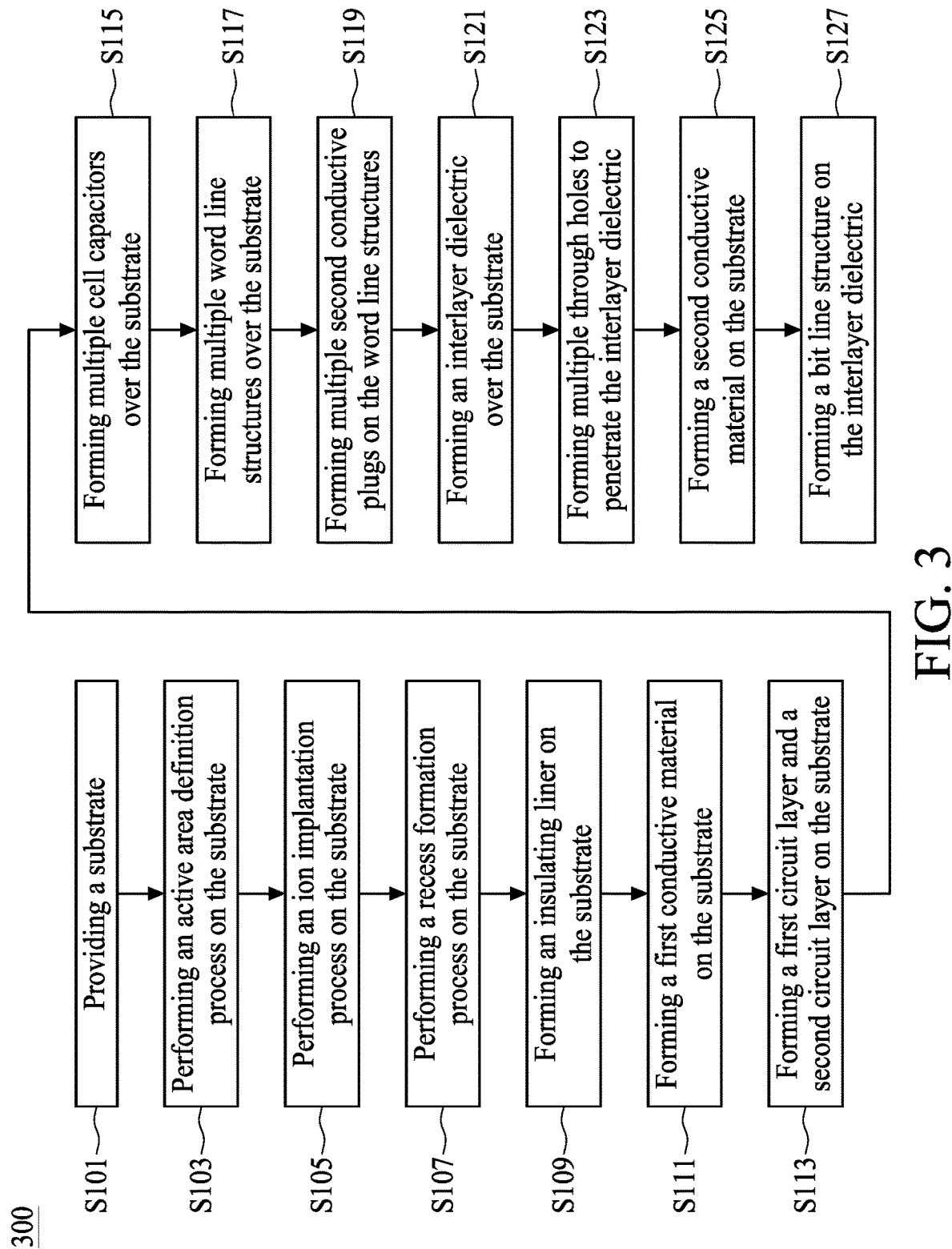
FIG. 3 is a flow diagram of a method for fabricating the semiconductor structure in FIG. 2, in accordance with some embodiments of the present disclosure.

FIG. 3 is a flow diagram of a method 300 for fabricating the semiconductor structure ST1 in FIG. 2, in accordance with some embodiments of the present disclosure. FIG. 4 to FIG. 22 are schematic cross-sectional views illustrating sequential fabrication stages according to the method 300 in FIG. 3, in accordance with some embodiments of the present disclosure.

Figure 4:
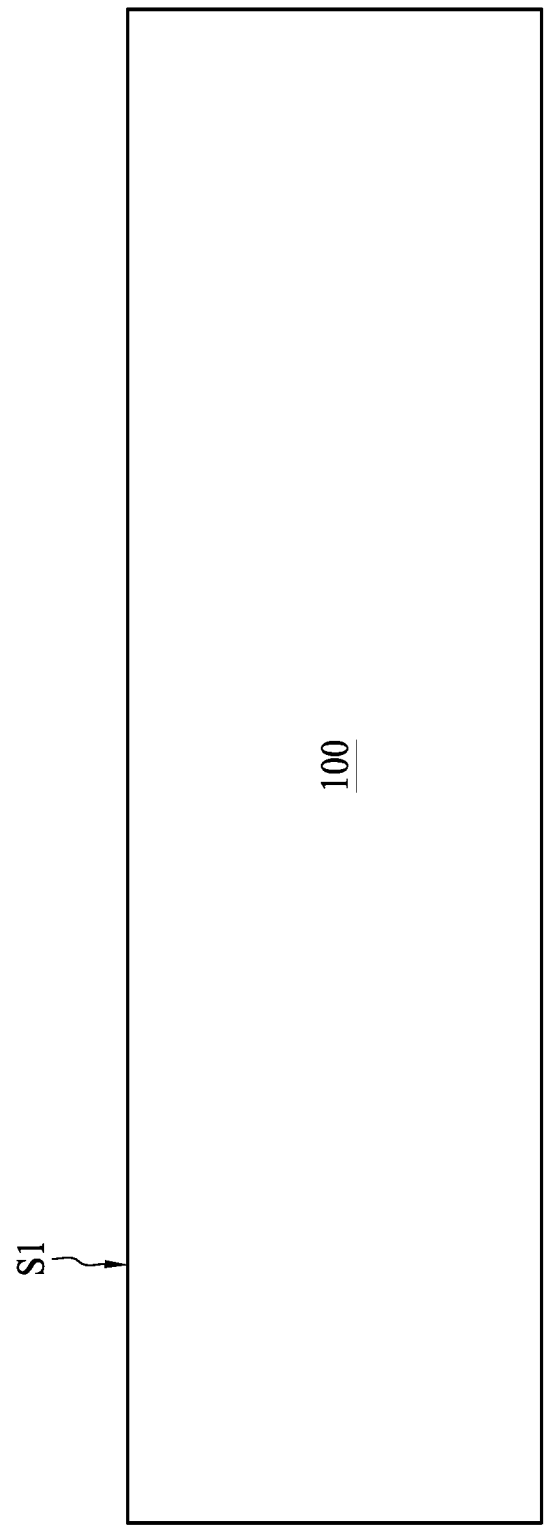
FIG. 4 to FIG. 22 are schematic cross-sectional views illustrating sequential fabrication stages according to the method in FIG. 3, in accordance with some embodiments of the present disclosure.
Figure 5:
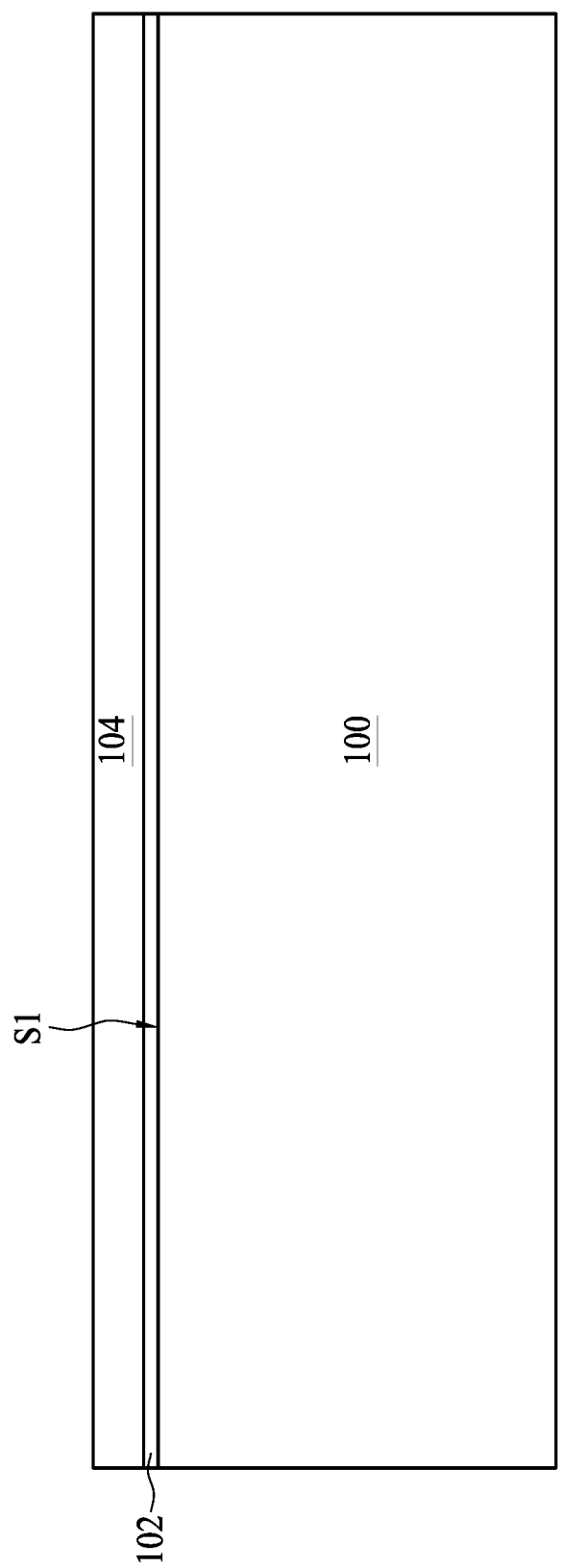

With reference to FIG. 4, a substrate 100 is provided according to step S101 in FIG. 3. In some embodiments, the substrate 100 may include single crystal silicon substrates, compound semiconductor substrates such as silicon germanium (SiGe) substrates, gallium arsenide (GaAs) substrates, silicon-on-insulator (SOI) substrates or other suitable substrates. The substrate 100 has a first top surface S1.

With reference to FIG. 5 to FIG. 9, an active area definition process is performed on the substrate 100 according to step S103 in FIG. 3. In some embodiments, the active area definition process is a shallow trench isolation (STI) formation process. First, referring to FIG. 5, a pad oxide layer 102 and a pad nitride layer 104 are sequentially formed on the first top surface S1 of the substrate 100. In some embodiments, the pad oxide layer 102 includes silicon oxide ($SiO_2$) and the pad nitride layer 104 includes silicon nitride ($Si_3N_4$). It should be understood that the pad oxide layer 102 and pad nitride layer 104 may be replaced with other suitable materials that provide high etching selectivity with respect to the substrate 100. In some embodiments, the pad oxide layer 102 can be deposited by conventional depositional processes, such as a chemical vapor deposition (CVD) process, or can be formed by thermally oxidizing a top thin portion of the substrate 100 in a furnace. The pad oxide layer 102 may be used to reduce an interfacial stress between the substrate 100 and the subsequently-formed pad nitride layer 104. In some embodiments, the pad nitride layer 104 is formed using a low-pressure chemical vapor deposition (LPCVD) process or a plasma-enhanced chemical vapor deposition (PECVD) process. The pad nitride layer 104 may be used as a barrier layer against water or oxygen molecules diffusing into the substrate.

Figure 6:
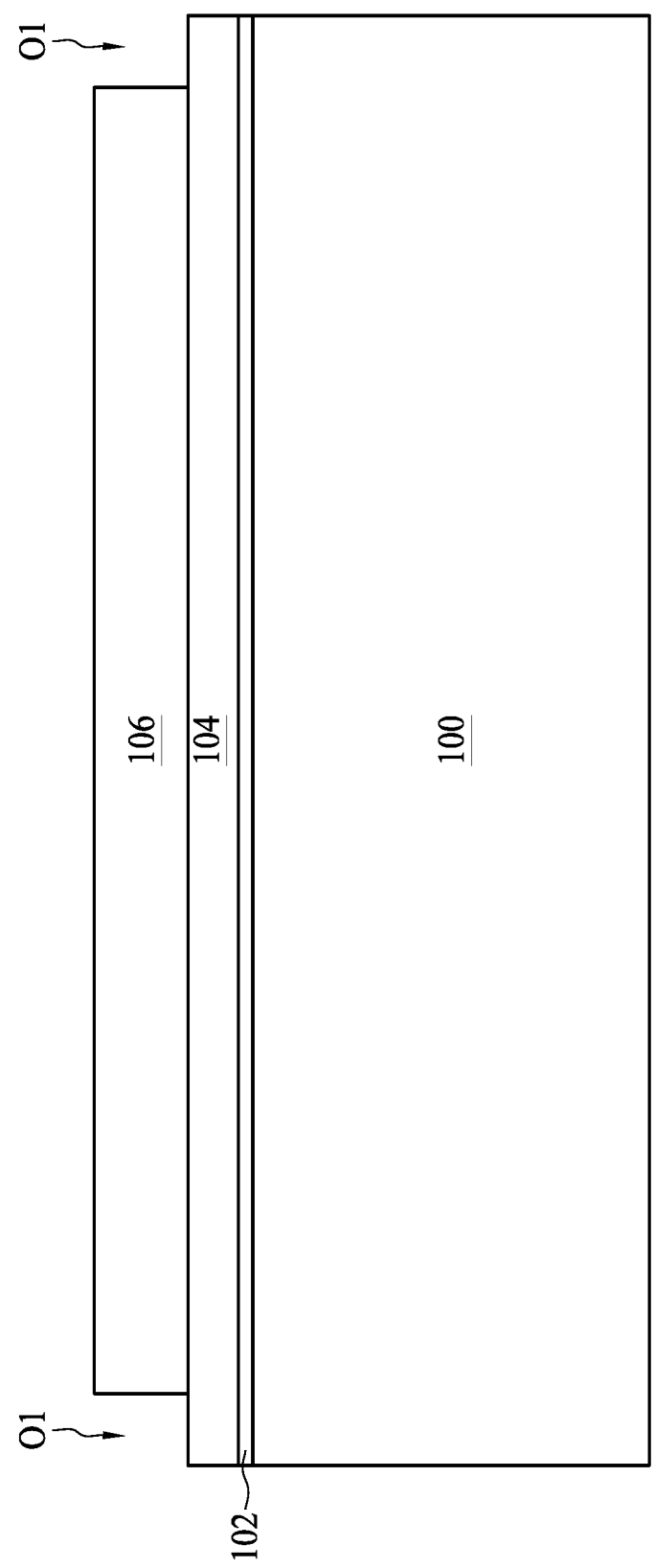

Next, referring to FIG. 6, a first photoresist pattern 106 is formed on the pad nitride layer 104 to define a location of an isolation region. In some embodiments, the first photoresist pattern 106 includes multiple first openings O1 exposing top surfaces of the pad nitride layer 104. Specifically, the formation of the first photoresist pattern 106 at least includes sequentially coating a first photoresist layer (not shown) on the pad nitride layer 104, exposing the first photoresist layer to a radiation using a first photomask (not shown) and a lithography process (not shown) and developing the exposed first photoresist layer.

Figure 7:
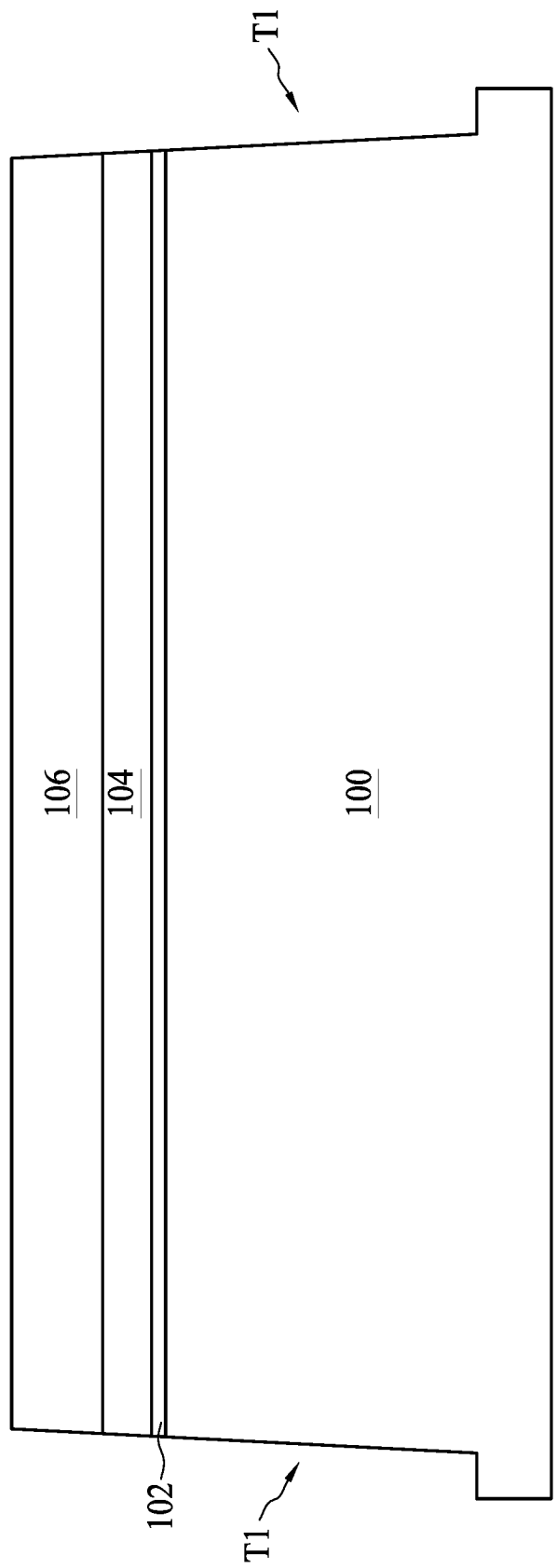

Next, referring to FIG. 7, the substrate 100, the pad oxide layer 102 and the pad nitride layer 104 are etched using the first photoresist pattern 106 as an etching mask. Specifically, portions of the substrate 100, the pad oxide layer 102 and the pad nitride layer 104 exposed by the first openings O1 are removed. Therefore, an isolation trench T1 is formed in the substrate 100 and the first photoresist pattern 106 is then removed using an ashing process or a wet strip process.

Figure 8:
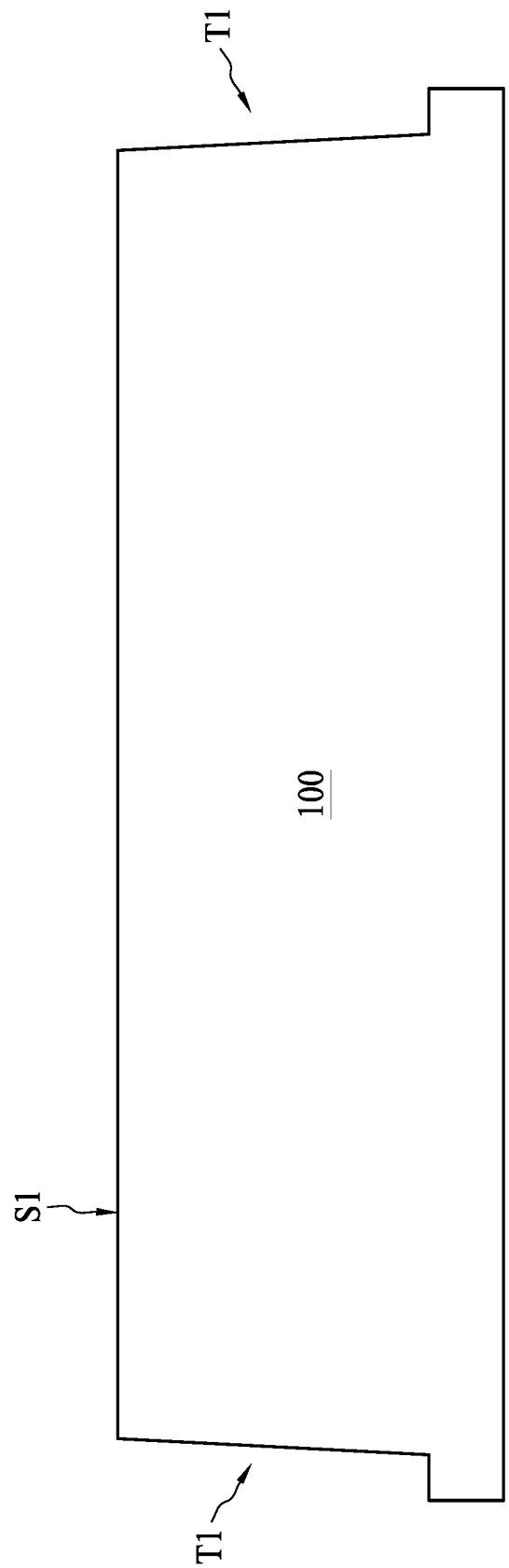

Subsequently, referring to FIG. 8, the pad oxide layer 102 and the pad nitride layer 104 exposing the isolation trench T1 are removed using a wet strip process. At such time, the first top surface S1 of the substrate 100 is exposed again.

Figure 9:
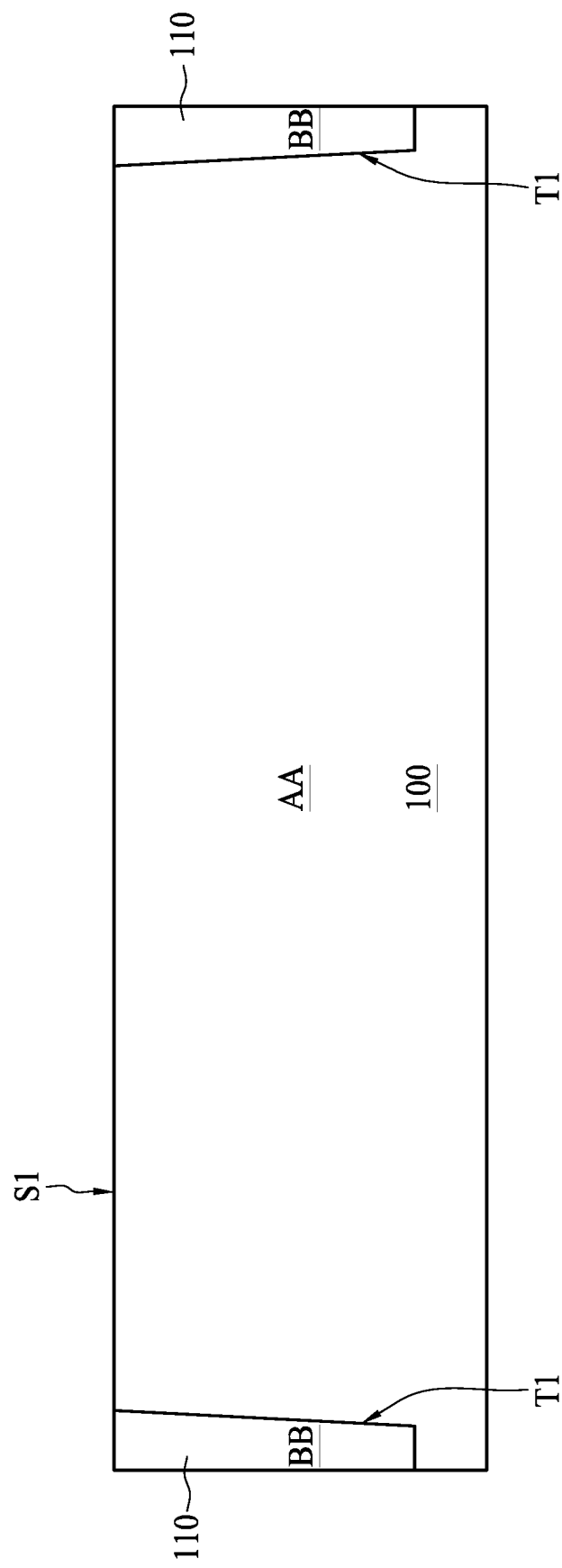

Next, referring to FIG. 9, the isolation trench T1 is filled with a first dielectric material 110 using a CVD process or a spin-coating process. In some embodiments, the first dielectric material 110 includes at least one of, silicon oxide ($SiO_2$), tetraethyl orthosilicate (TEOS), boron phosphorus silicate glass (BPSG) and undoped silicate glass (USG). In some embodiments, after the isolation trench T1 is filled with the first dielectric material 110, a chemical mechanical planarization (CMP) process may be performed to planarize a top surface of the first dielectric material 110 so that the top surface of the first dielectric material 110 does not protrude above the first top surface S1 of the substrate 100.

Still referring to FIG. 9, the isolation trench T1 filled with the first dielectric material 110 form an isolation region BB. In some embodiments, the isolation region BB may be arranged at predetermined intervals in the substrate 100. In addition, an active region AA is surrounded by the isolation region BB and multiple active regions AA may be alternately arranged with the isolation region BB in the substrate 100.

Figure 10:
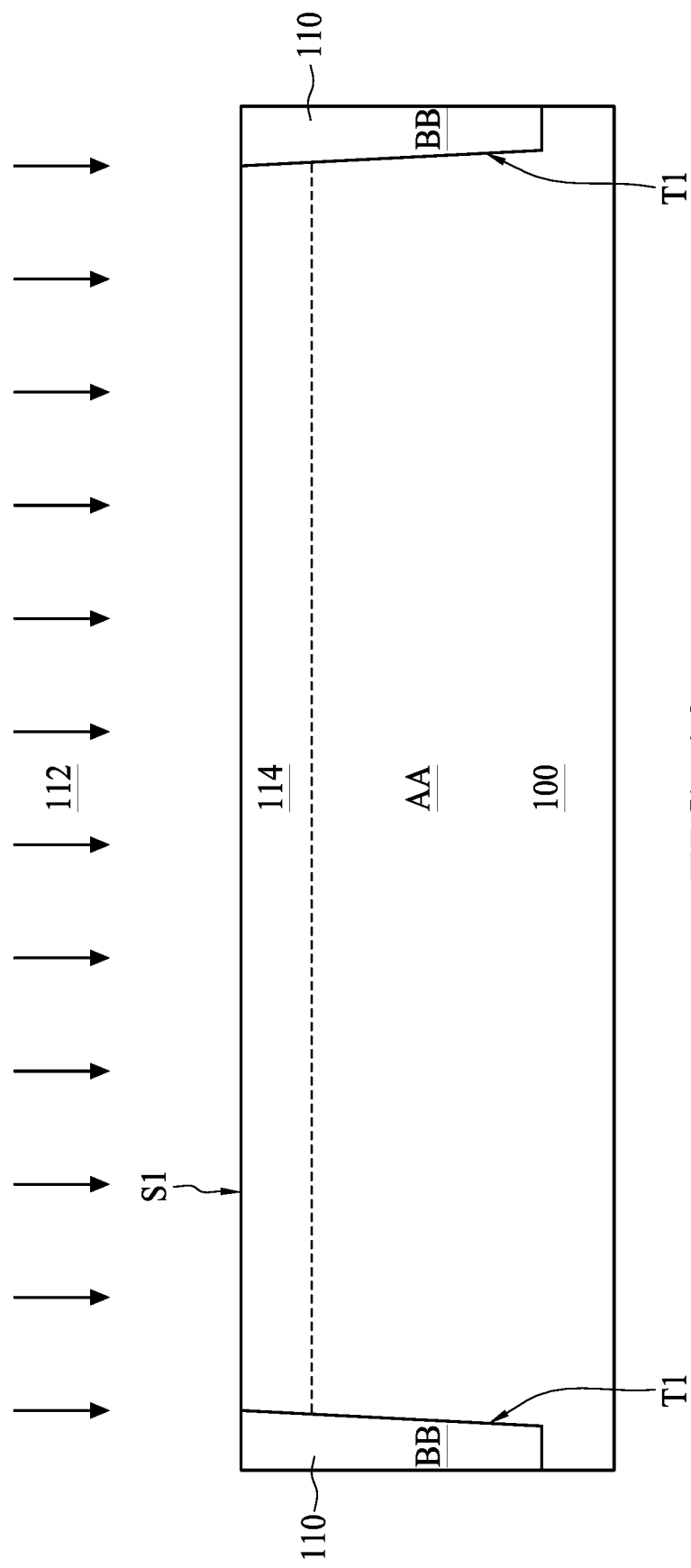

With reference to FIG. 10, an ion implantation process is performed on the substrate 100 according to step S105 in FIG. 3. Specifically, the ion implantation process may include one or more doping processes. For example, a dopant 112 may be implanted into the substrate 100 to form an impurity region 114 in the active region AA. The impurity region 114 is surrounded by the isolation region BB and the bottom surface of the impurity region 114 may be positioned at a predetermined depth from the first top surface S1 of the substrate 100. In some embodiments, the impurity region 114 can be an n-type doped region when the dopant 112 includes phosphorus (P) or arsenic (As). At such time, the impurity region 114 has electrons as the majority carrier. In some embodiments, the impurity region 114 can be a p-type doped region when the dopant 112 includes boron (B), gallium (Ga) or indium (In). At such time, the impurity region 114 has electron holes as the majority carrier. In some embodiments, an annealing process may be performed to repair the damage caused by the ion implantation process and to activate the dopant 112.

Figure 11:
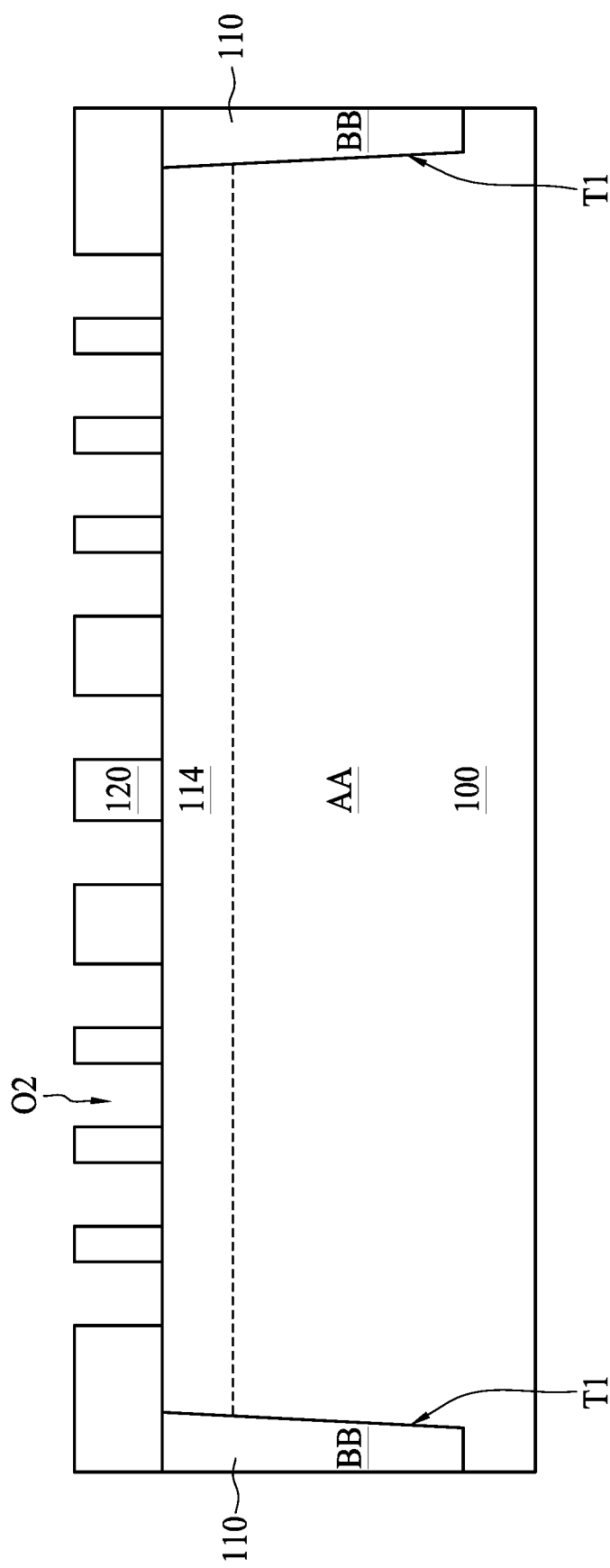
Figure 12:
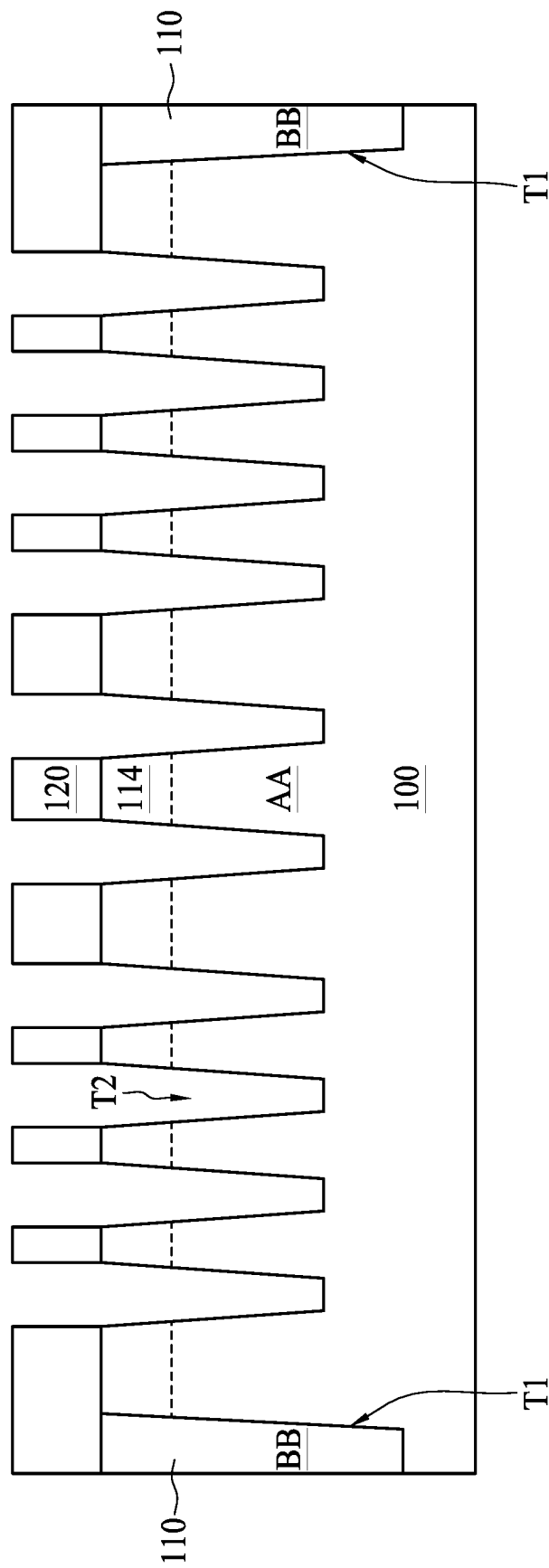

With reference to FIG. 11 and FIG. 12, a recess formation process is performed on the substrate 100 according to step S107 in FIG. 3. First, referring to FIG. 11, a second photoresist pattern 120 is formed on the substrate 100 to define the location of recesses. In some embodiments, the second photoresist pattern 120 includes multiple second openings O2 exposing a top surface of the impurity region 114. Specifically, the formation of the second photoresist pattern 120 at least includes sequentially coating a second photoresist layer (not shown) on the active region AA and the isolation region BB, exposing the second photoresist layer to a radiation using a second photomask (not shown) and a lithography process (not shown) and developing the exposed second photoresist layer.

Next, referring to FIG. 12, the active region AA is etched using the second photoresist pattern 120 as an etching mask. Specifically, portions of the active region AA exposed by the second openings O2 are removed. Therefore, multiple recesses T2 are formed in the active region AA and the second photoresist pattern 120 is then removed using an ashing process or a wet strip process. In some embodiments, the depth of the recess T2 is less than that of the isolation trench T1. In some embodiments, the recess T2 is a line-type channel that extends in any one direction in the active region AA. Therefore, the impurity region 114 is divided by the recesses T2 into multiple impurity regions 114. In some embodiments, bottom surfaces of the impurity regions 114 are higher than the bottom surfaces of the recesses T2.

Figure 13:
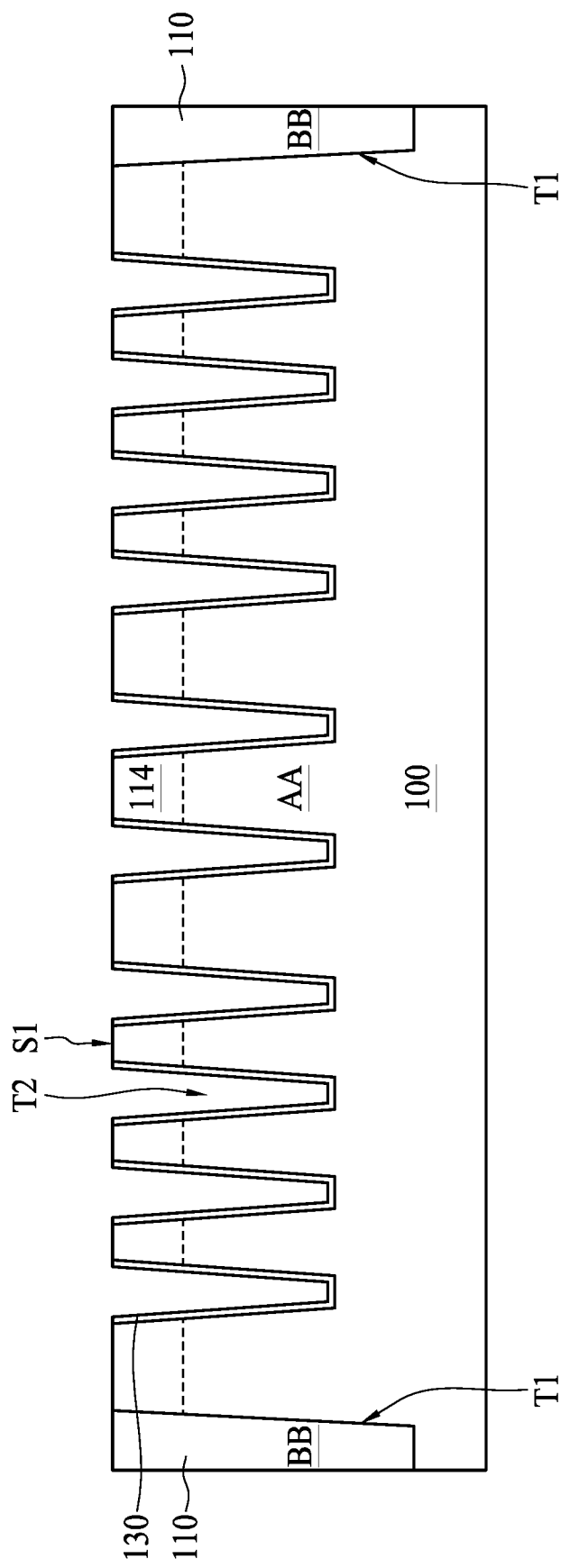

With reference to FIG. 13, an insulating liner 130 is formed on the substrate 100 according to step S109 in FIG. 3. Specifically, first, the insulating liner 130 is deposited over the active region AA and the isolation region BB and conformally formed within the recesses T2. Next, a CMP process is performed to remove portions of the insulating liner 130 over the first top surface S1. As a result, remaining portions of the insulating liner 130 line the inner sidewalls of the recesses T2. In some embodiments, the insulating liner 130 is formed using a CVD process. Preferably, the insulating liner 130 is formed using an atomic layer deposition (ALD) process to allow for formation of a highly conformal insulating liner 130 having a more uniform thickness. In some embodiments, the insulating liner 130 includes silicon oxide ($SiO_2$) or other suitable materials.

Figure 14:
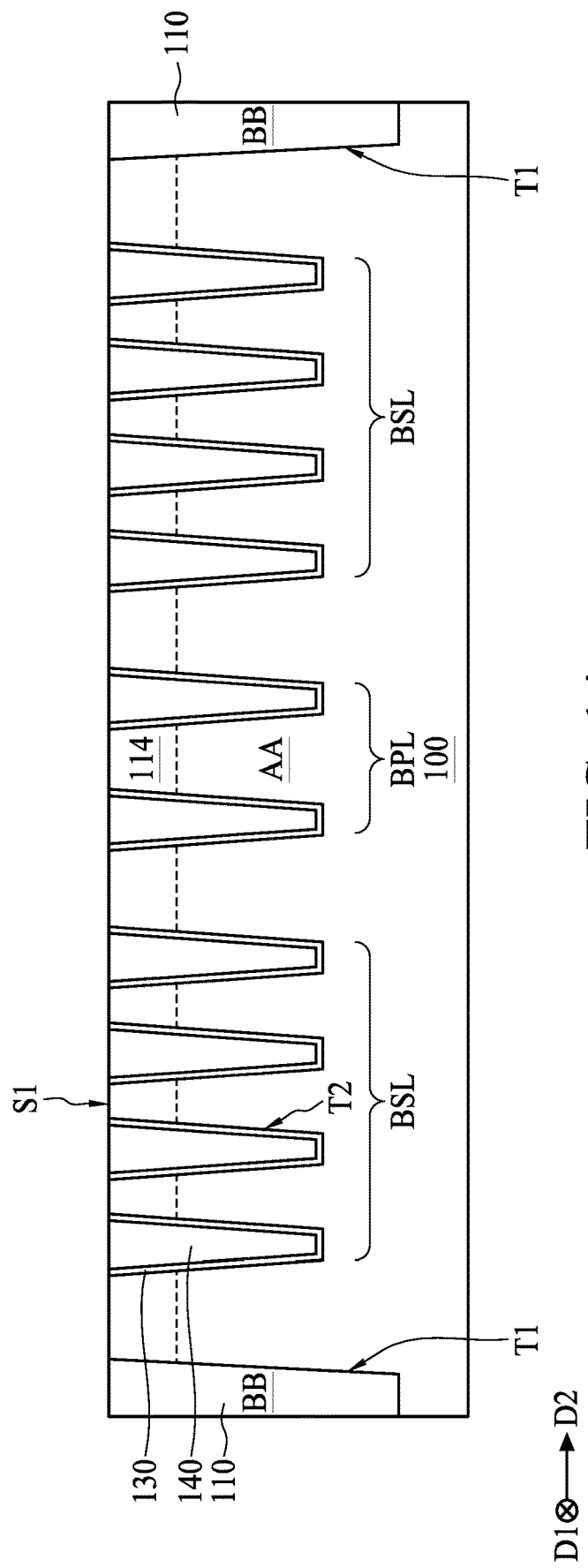

With reference to FIG. 14, a first conductive material 140 is formed on the substrate 100 according to step S111 in FIG. 3. Specifically, first, the first conductive material 140 is deposited over the active region AA and the isolation region BB and completely fills the recesses T2 lined with the insulating liner 130. Next, a CMP process is performed to remove the first conductive material 140 over the first top surface S1. As a result, the first conductive material 140 surrounded by the insulating liner 130 is left in the recesses T2.

In some embodiments, the first conductive material 140 is formed using a CVD process, a physical vapor deposition (PVD) process or an electroplating process. In some embodiments, the first conductive material 140 includes various metals such as aluminum (Al), copper (Cu), tungsten (W), titanium (Ti) or other suitable materials. In some embodiments, before the first conductive material 140 is deposited on the insulating liner 130, a metal seed layer (not shown) is conformally formed on the insulating liner 130 to assist in the adhesion between the insulating liner 130 and the subsequently-formed first conductive material 140. The material of the metal seed layer is selected according to the material used in the first conductive material 140.

Still referring to FIG. 14, in some embodiments, the first conductive material 140 surrounded by the insulating liner 130 in the substrate 100 forms a signal line or a power line. Specifically, the first conductive material 140 located at the central portion of the active region AA forms a buried power line BPL and the first conductive material 140 located at the peripheral portion of the active region AA forms a buried signal line BSL. In other words, the buried power line BPL is distal to the isolation region BB and the buried signal line BSL is proximal to the isolation region BB. In some embodiments, the buried power line BPL and the buried signal line BSL extend in a first direction D1, as shown in FIG. 14. In addition, multiple buried power lines BPL and multiple buried signal lines BSL are arranged along a second direction D2 orthogonal to the first direction D1. The buried power line BPL may be provided with a supply voltage ($V_{cc}$) to power the electronic components that will be subsequently formed thereon. The buried signal line BSL may be electrically coupled to multiple signal-transmission pins (not shown) used to transmit various data signals (DQ) or data strobe signals (DQS).

Figure 15:
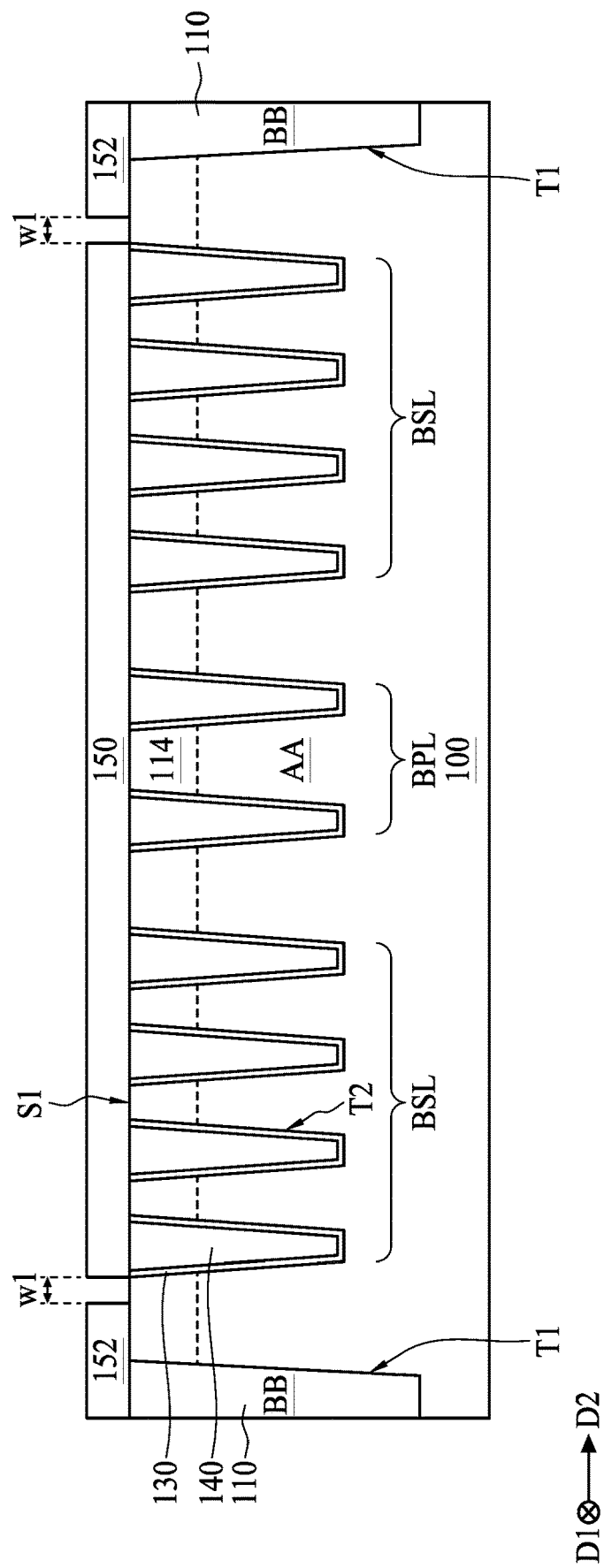

With reference to FIG. 15, a first circuit layer 150 and a second circuit layer 152 are formed on the substrate 100 according to step S113 in FIG. 3. Specifically, the first circuit layer 150 and the second circuit layer 152 are disposed on the first top surface S1 of the substrate 100 and separated from each other by a predetermined distance w1. In some embodiments, the first circuit layer 150 covers the buried power lines BPL and the buried signal lines BSL, and the first circuit layer 150 is electrically coupled to the buried power lines BPL and the buried signal lines BSL. The second circuit layer 152 does not cover the buried power lines BPL or the buried signal lines BSL. In some embodiments, the first circuit layer 150 and the second circuit layer 152 may function as a sense amplifier (SA) circuit or a sub-word line driver (SWD) circuit. The first circuit layer 150 and the second circuit layer 152 will be electrically coupled to the electronic components subsequently formed thereon.

Figure 16:
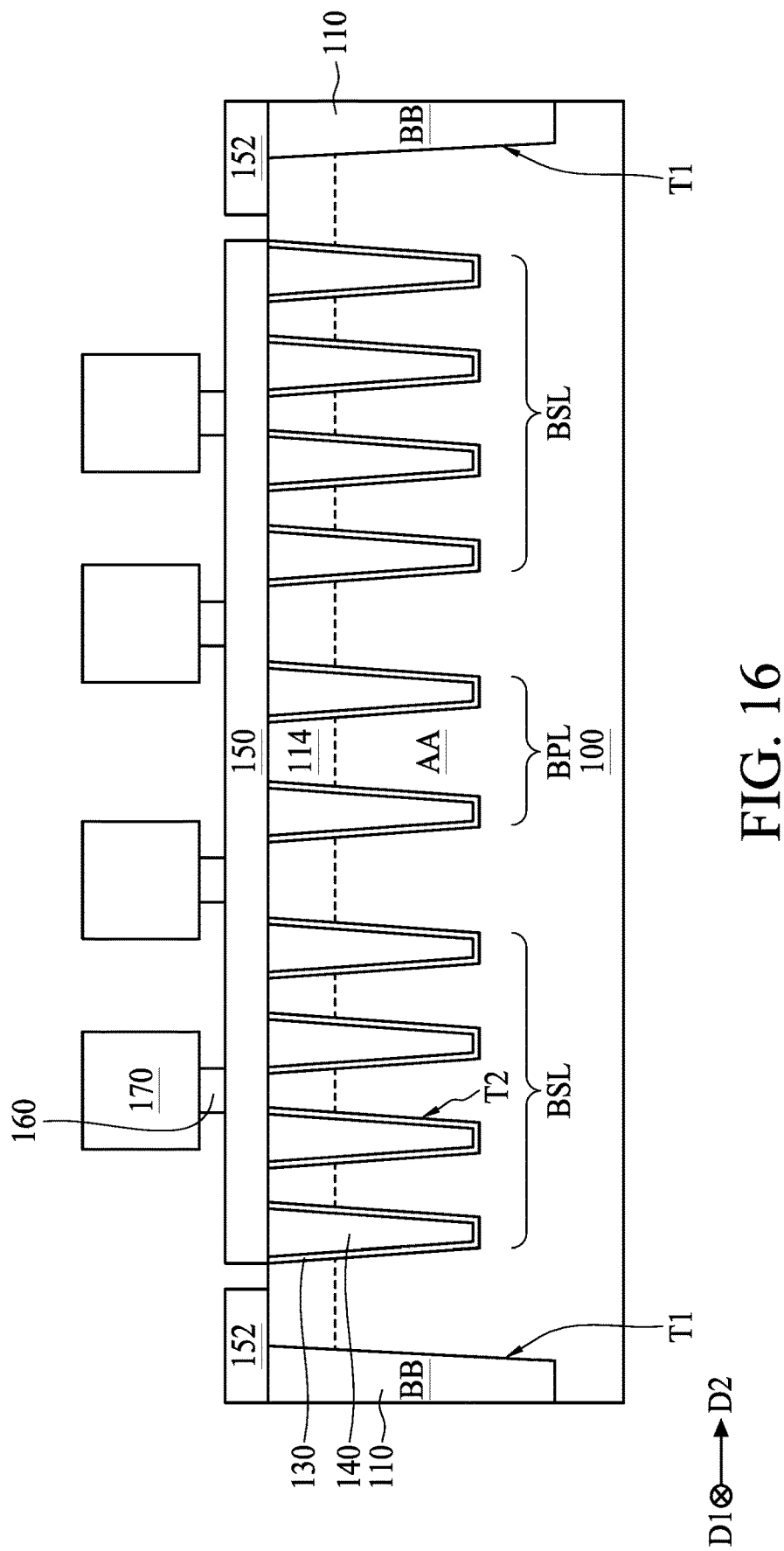

With reference to FIG. 16, multiple cell capacitors 170 are formed over the substrate 100 according to step S115 in FIG. 3. Specifically, the cell capacitors 170 are electrically coupled to the first circuit layer 150 via multiple landing pads 160, wherein one cell capacitor 170 is disposed on each landing pad 160 formed on the first circuit layer 150. In addition, the cell capacitor 170 is electrically coupled to the impurity region 114. The cell capacitor 170 is used to store a charge, which represents a bit of information. The formation of the landing pad 160 may include at least a lithographic process, an etching process and a deposition process known in the art. In some embodiments, the material of the landing pad 160 includes tungsten (W), copper (Cu), aluminum (Al) or alloys thereof, but is not limited thereto.

It should be understood that the cell capacitor 170 shown in FIG. 16 is for illustration purpose only and the detailed architecture of the cell capacitor 170 is not shown. In some embodiments, the cell capacitor 170 at least includes a bottom electrode, a top electrode and a capacitor dielectric material encased by the bottom electrode and the top electrode. The bottom electrode and the top electrode may be a conductor, such as a metal, alloys or polysilicon. The capacitor dielectric material may be formed with one or more high-k dielectric materials, such as hafnium oxide ($HfO_2$), zirconium oxide ($ZrO_2$), tantalum oxide ($Ta_2O_5$), aluminum oxide ($Al_2O_3$) or the like. In some embodiments, the cell capacitor 170 may be any shape of capacitors known in the art. For example, the shape of the cell capacitor 170 can be simple, such as a rectangle, or complex, such as concentric cylinders or stacked discs.

Figure 17:
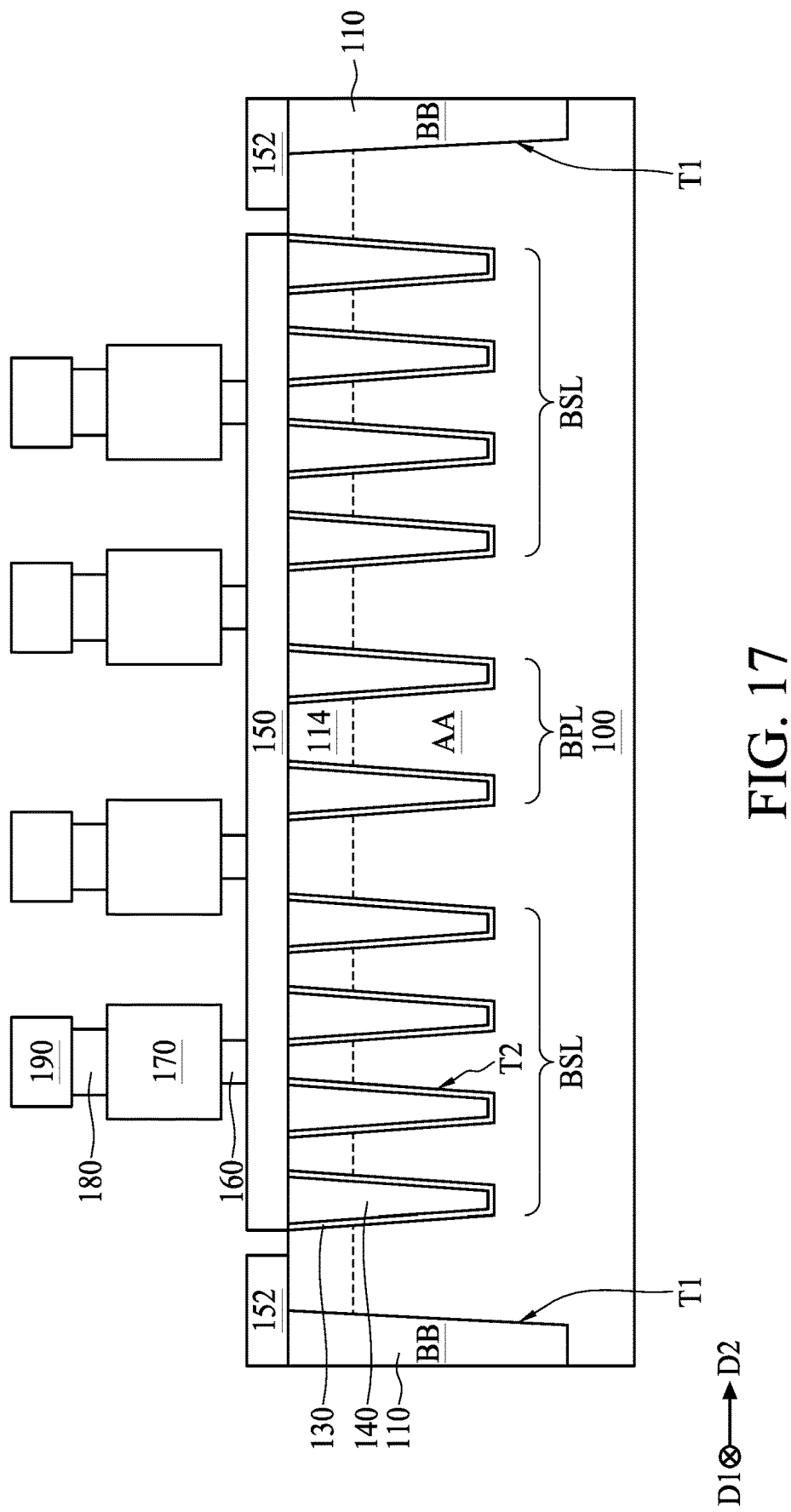

With reference to FIG. 17, multiple word line structures 190 are formed over the substrate 100 according to step S117 in FIG. 3. Specifically, the word line structures 190 are electrically coupled to the cell capacitors 170 via first conductive plugs 180, wherein each word line structure 190 is disposed on a first conductive plug 180 formed on a cell capacitor 170. In some embodiments, the cell capacitor 170 is interposed between the first circuit layer 150 and the word line structure 190.

The formation of the first conductive plug 180 may include at least a lithographic process, an etching process and a deposition process known in the art. In some embodiments, the first conductive plug 180 is a conductor, such as a metal, alloys or polysilicon. It should be understood that the word line structure 190 shown in FIG. 17 is for illustration purpose only and the detailed architecture of the word line structure 190 is not shown.

In some embodiments, the word line structure 190 at least includes a gate dielectric material, a gate electrode and a gate spacer. The gate electrode is disposed on the gate dielectric material and the gate spacer. The gate dielectric material is surrounded by the gate spacer. In some embodiments, the gate dielectric material includes silicon oxide ($SiO_2$) or other suitable materials. In some embodiments, the gate electrode is a metal gate that includes tungsten (W), aluminum (Al), copper (Cu), titanium (Ti) or other materials with a proper work function or a polysilicon gate.

In some embodiments, the gate spacer is an insulator that may include nitride, low-k dielectrics or other suitable materials. In some embodiments, the word line structure 190 may include a non-silicon based material or a heat-sensitive material. In some embodiments, the word line structure 190 extends in the first direction D1, as shown in FIG. 17. In addition, multiple word line structures 190 are arranged along the second direction D2 orthogonal to the first direction D1.

Figure 18:
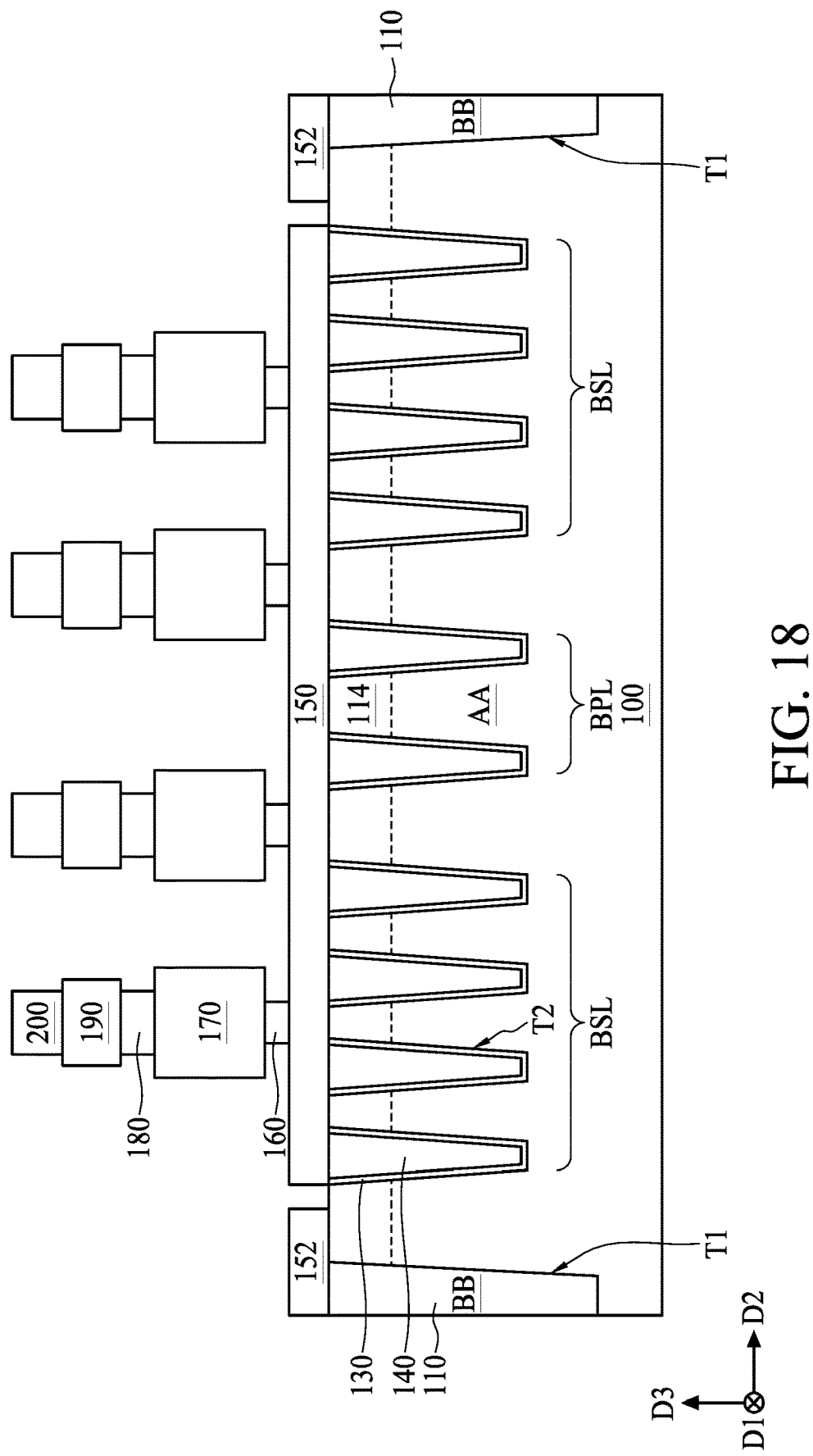

With reference to FIG. 18, multiple second conductive plugs 200 are formed on the word line structures 190 according to step S119 in FIG. 3. Specifically, each second conductive plug 200 is disposed on a word line structure 190. The formation of the second conductive plug 200 may include at least a lithographic process, an etching process and a deposition process known in the art. In some embodiments, the second conductive plug 200 is a conductor, such as a metal, alloys or polysilicon.

In some embodiments, stacks of the landing pad 160, the cell capacitor 170, the first conductive plug 180, the word line structure 190 and the second conductive plug 200 extend along a third direction D3 substantially orthogonal to both the first direction D1 and the second direction D2. In some embodiments, the gate electrode in the word line structure 190 may serve as the gate terminal of a cell transistor used to control the word line structure 190. The first conductive plug 180 and the second conductive plug 200, which are immediately below and above the word line structure 190, may serve as a source terminal and a drain terminal of the cell transistor. The cell transistor acts as a switch for the cell capacitor 170. That is, the cell transistor controls charging and discharging of the cell capacitor 170.

Figure 19:
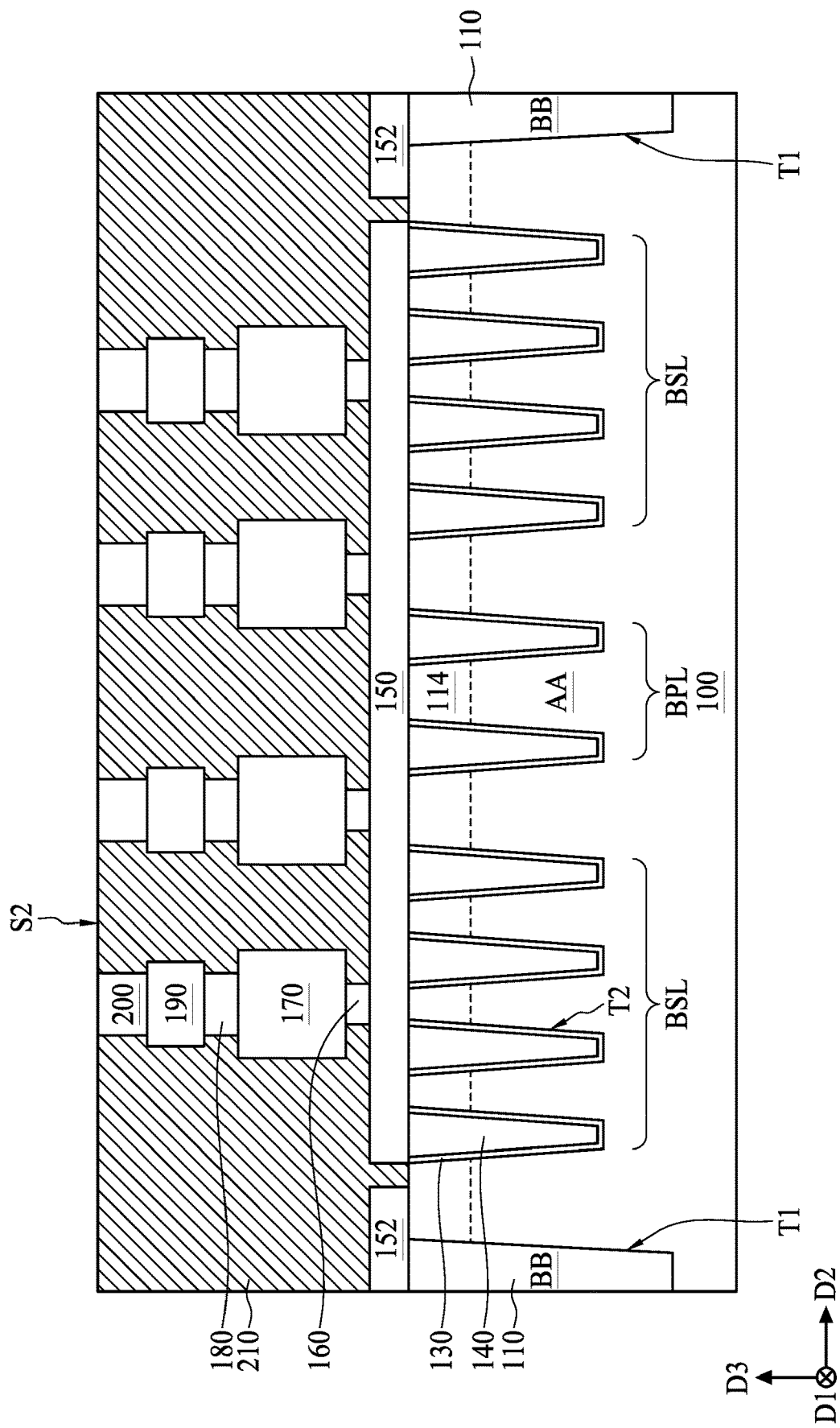

With reference to FIG. 19, an interlayer dielectric 210 is formed over the substrate 100 according to step S121 in FIG. 3. Specifically, the interlayer dielectric 210 covers the first circuit layer 150, the second circuit layer 152 and a portion of the impurity region 114. In addition, the interlayer dielectric 210 encapsulates the landing pads 160, the cell capacitors 170, the first conductive plugs 180, the word line structures 190 and the second conductive plugs 200.

In some embodiments, the interlayer dielectric 210 mainly includes oxide such as silicon oxide ($SiO_2$) or other suitable materials formed using a CVD process. In some embodiments, the formation of the interlayer dielectric 210 may include several steps. For example, in a first step, the interlayer dielectric 210 may be deposited to a level that even with the top surface of the cell capacitor 170. In a second step, the interlayer dielectric 210 may be deposited to a level that is even with the top surface of the word line structure 190. In a third step, the interlayer dielectric 210 may be deposited to completely cover the second conductive plug 200. After the third step, a CMP process is performed to planarize the interlayer dielectric 210 to expose the top surface of the second conductive plug 200. At such time, the interlayer dielectric 210 has a planar second top surface S2 coplanar with the top surface of the second conductive plug 200.

Figure 20:
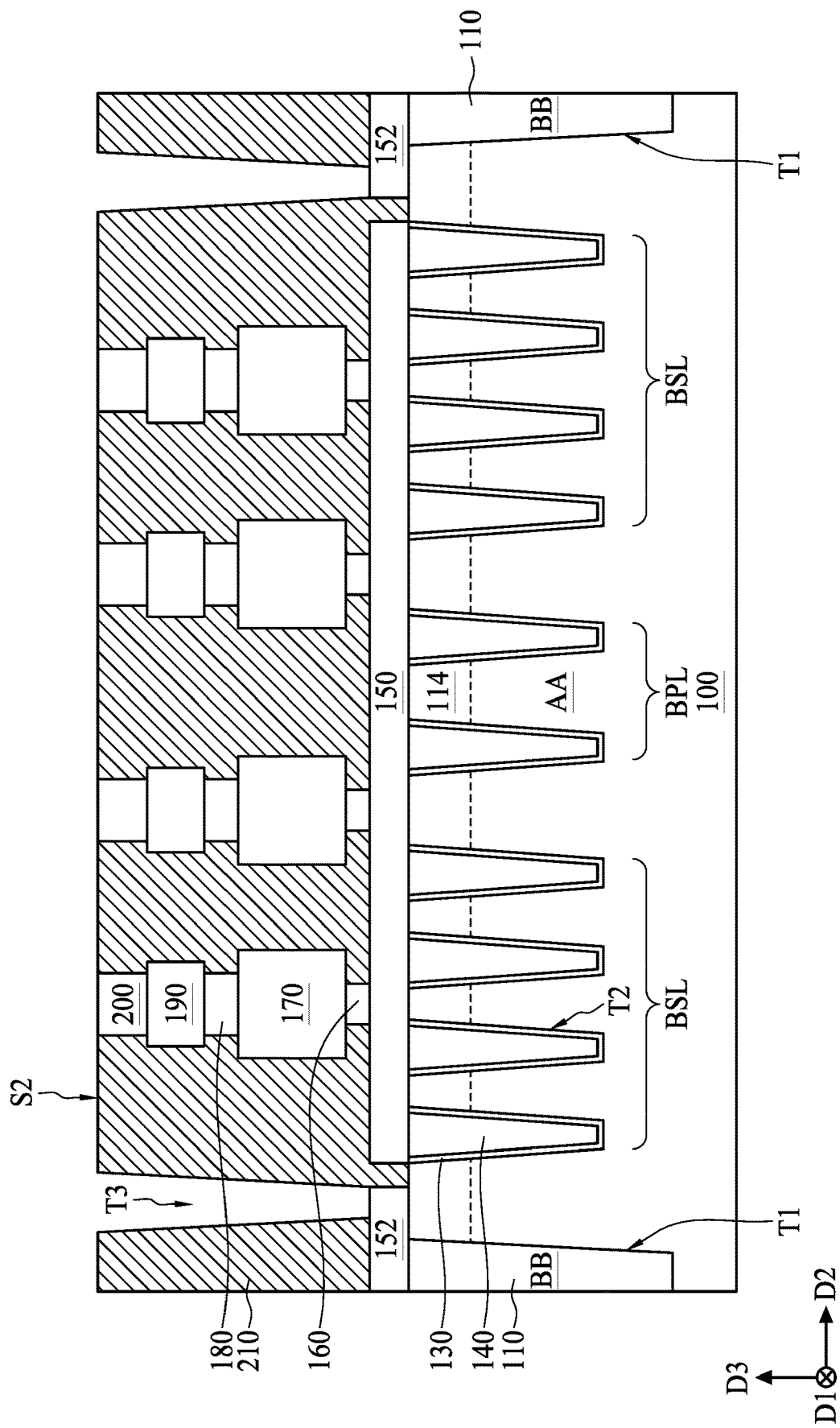

With reference to FIG. 20, multiple through holes T3 are formed to penetrate the interlayer dielectric 210 according to step S123 in FIG. 3. Specifically, the formation of the through holes T3 at least includes forming a photoresist pattern (not shown) on the interlayer dielectric 210, etching the interlayer dielectric 210 until the second circuit layer 152 is exposed and then removing the photoresist pattern.

Figure 21:
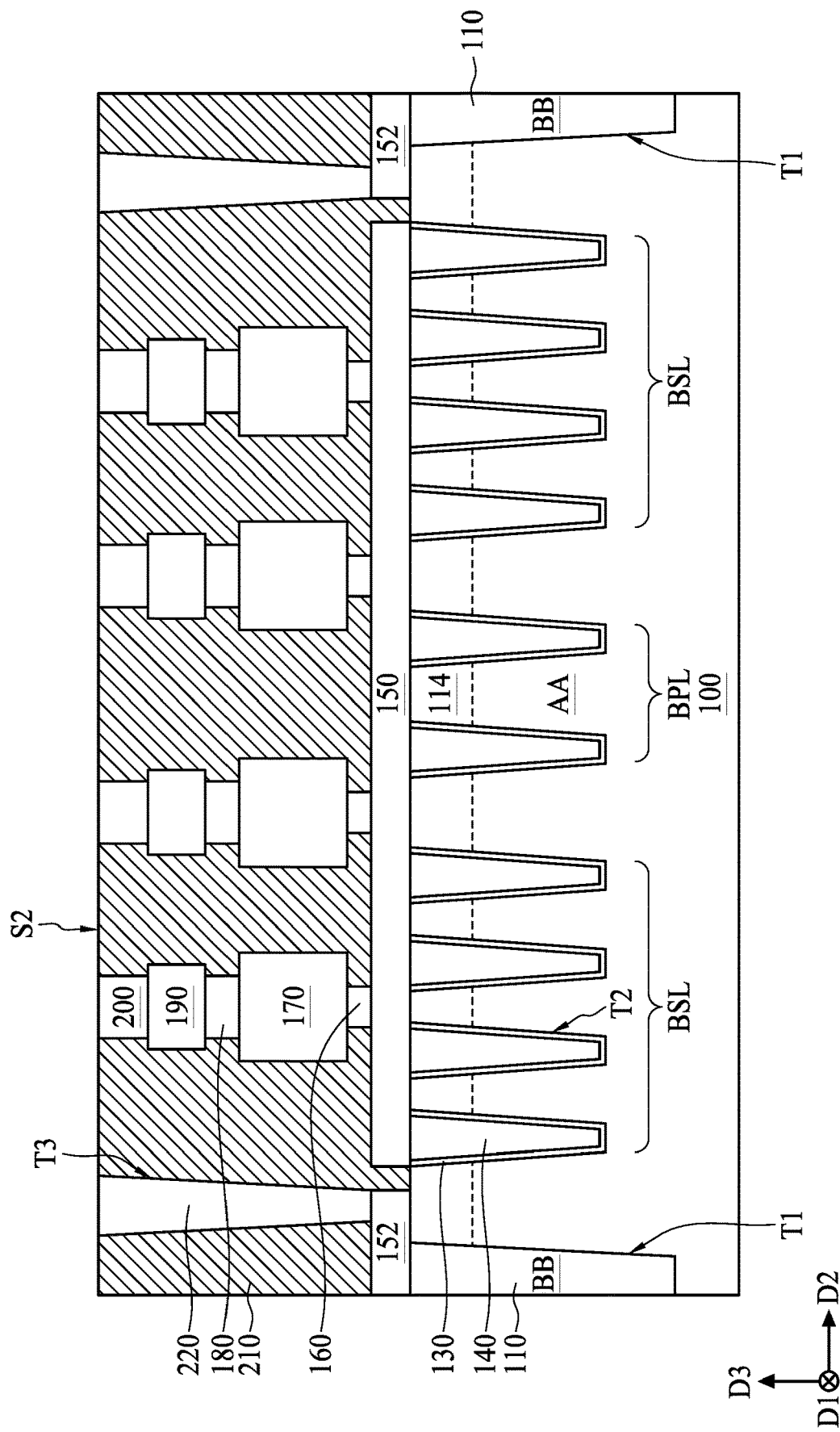

With reference to FIG. 21, a second conductive material 220 is formed on the substrate 100 according to step S125 in FIG. 3. Specifically, first, the second conductive material 220 is deposited over the interlayer dielectric 210 and completely fills the through hole T3. Next, a CMP process is performed to remove the second conductive material 220 over the second top surface S2. As a result, the second conductive material 220 is left in the through hole T3 surrounded by the interlayer dielectric 210. In some embodiments, the second conductive material 220 is formed using a CVD process, a PVD process or an electroplating process. In some embodiments, the second conductive material 220 includes various metals such as aluminum (Al), copper (Cu), tungsten (W), titanium (Ti) or other suitable materials.

Figure 22:
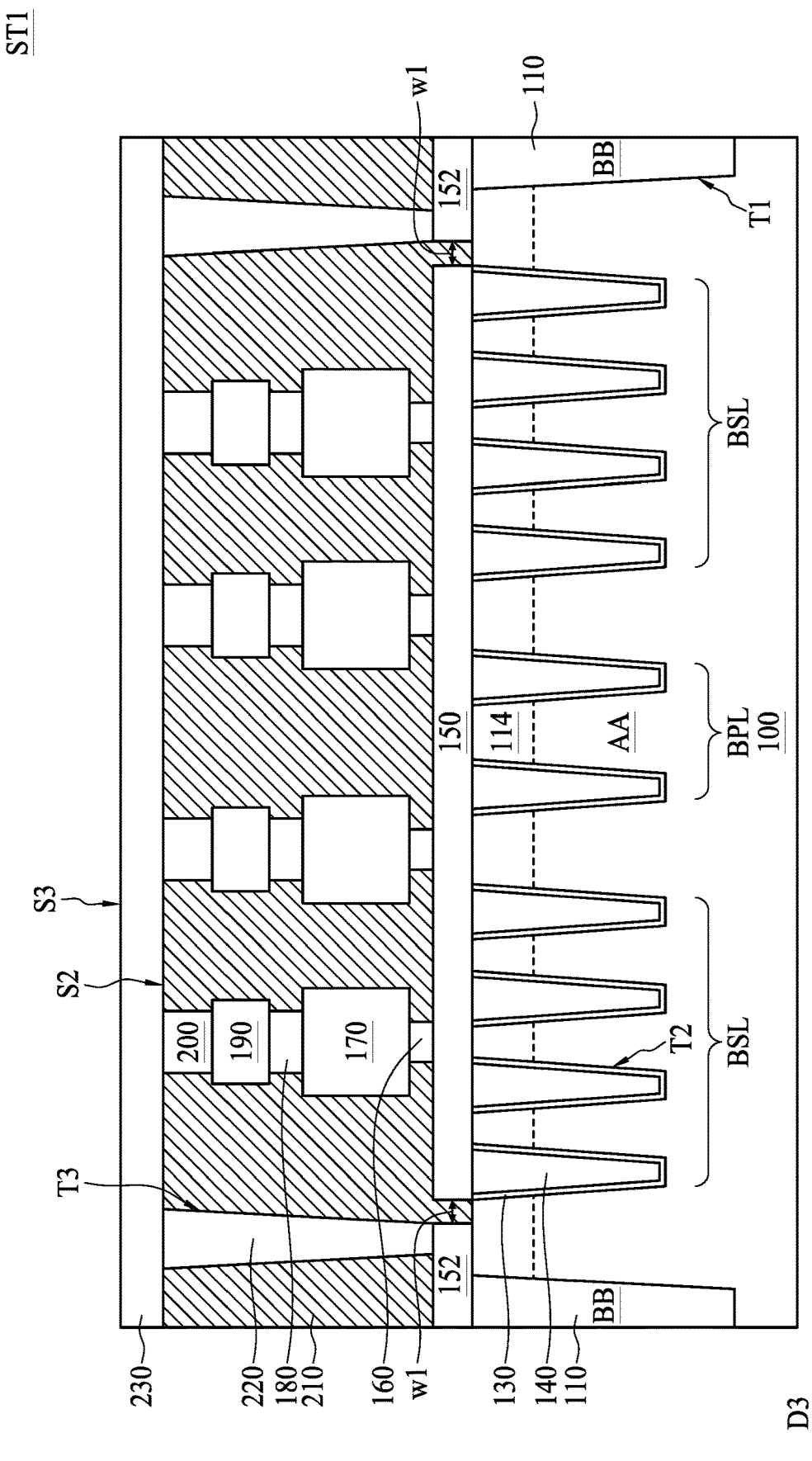

With reference to FIG. 22, a bit line structure 230 is formed on the interlayer dielectric 210 according to step S127 in FIG. 3. Specifically, the bit line structure 230 is disposed over the word line structure 190. In some embodiments, the word line structure 190 is interposed between the cell capacitor 170 and the bit line structure 230. In some embodiments, the bit line structure 230 is formed using a CVD process, a PVD process or an electroplating process. In some embodiments, the bit line structure 230 is a conductor, such as a metal or polysilicon. Preferably, the bit line structure 230 is a metal alloy, such as tungsten silicide (WSi). In some embodiments, the bit line structure 230 extends in the second direction D2, as shown in FIG. 22. At such time, a semiconductor structure ST1 is generally formed, wherein the semiconductor structure ST1 primarily includes a memory array.

In some embodiments, the bit line structure 230 is electrically coupled to the word line structure 190 and the cell capacitor 170. The bit line structure 230 may be used to transmit a signal to the cell capacitor 170 so that data stored in the cell capacitor 170 can be read, or the signal can be stored as data and written in the cell capacitor 170. In some embodiments, the second conductive material 220 deposited in the through hole T3 is substantially a bit line contact (BLC) electrically connecting the bit line structure 230 to the second circuit layer 152 and to the impurity region 114. In some embodiments, the bit line contact extends in the third direction D3.

Figure 23:
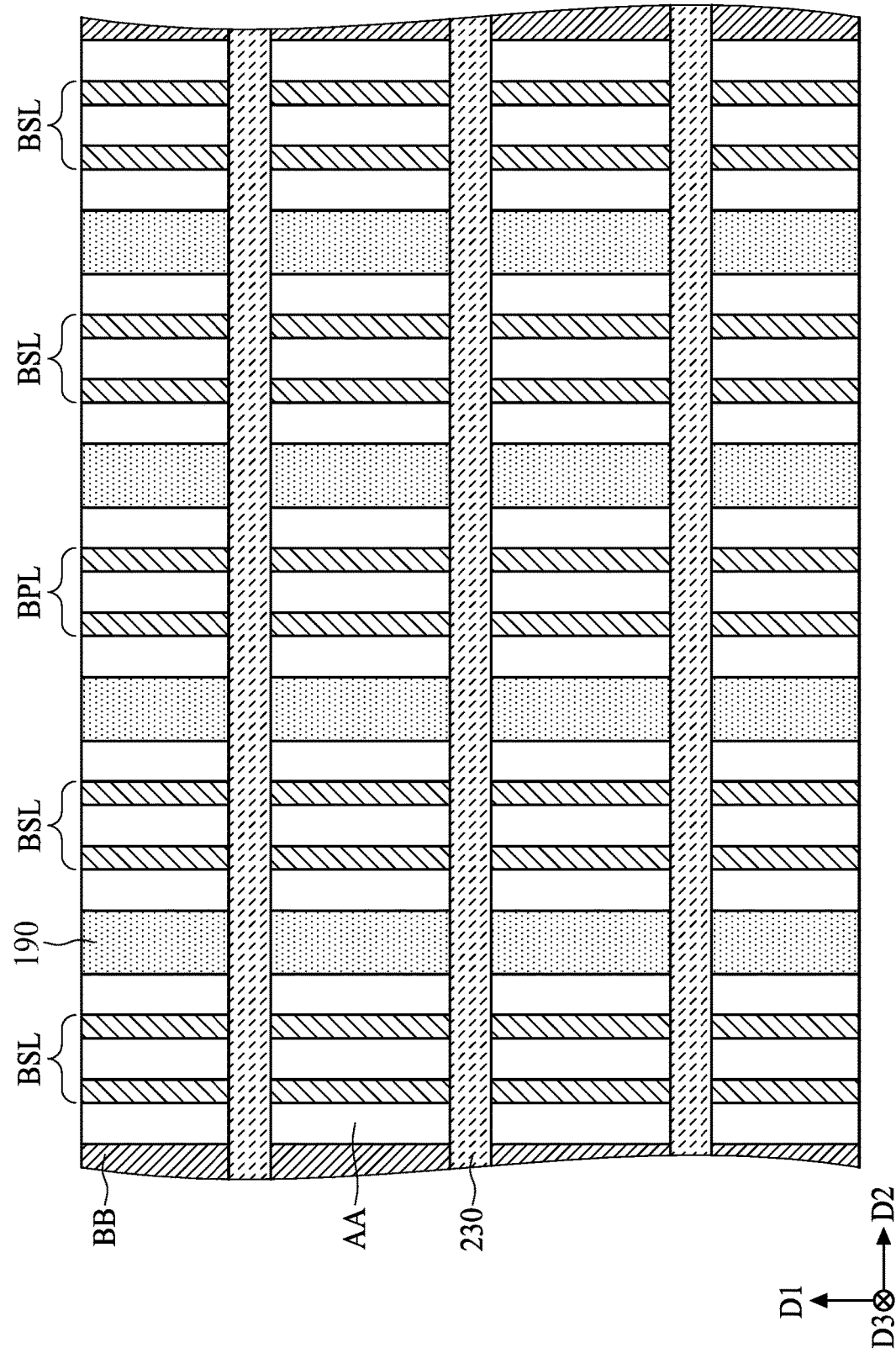
FIG. 23 is a schematic top view of the semiconductor structure in FIG. 22, in accordance with some embodiments of the present disclosure.

FIG. 23 is a schematic top view of the semiconductor structure ST1 in FIG. 22, in accordance with some embodiments of the present disclosure. Referring to FIG. 23, the buried power line BPL, the buried signal line BSL and the word line structure 190 extend in the first direction D1 and the bit line structure 230 extends in the second direction D2 substantially orthogonal to the first direction D1. Therefore, multiple word line structures 190 and multiple bit line structures 230 may form the columns and rows of a memory array. Compared with the buried power line BPL and the buried signal line BSL within the substrate 100, the word line structure 190 is discrete from the substrate 100 such that the word line structure 190 is spatially higher than both the buried power line BPL and the buried signal line BSL.

However, the word line structure 190, the buried power line BPL and the buried signal line BSL are basically arranged along the second direction D2. The bit line structure 230 is more discrete from the substrate 100 than the word line structure 190 such that the bit line structure 230 is spatially higher than the word line structure 190. A cell capacitor 170 not shown in FIG. 23 is located at the intersection of each word line structure 190 and each bit line structure 230. In some embodiments, the word line structures 190 and the bit line structures 230 substantially form a $4F^2$ layout for a memory array.

In the present disclosure, power lines and signal lines are buried in the substrate while main components of a memory array, i.e., word line structures, bit line structures and cell capacitors, are disposed over the substrate. In addition, a capacitor-first process is adopted for fabricating the memory array with a $4F^2$ layout when heat-sensitive non-silicon based materials are used in the fabrication of cell transistors. Due to the minimized area of unit memory cells, space available for metal routing including the arrangement of power lines and signal lines adjacent to the main components becomes limited. The present application employs multiple recesses that are generally used to accommodate buried word line structures in a $6F^2$ layout for a memory array to accommodate power lines and signal lines. The advantage of disposing the power line and the signal line in the recess includes saving the space originally used for metal routing above the substrate. As a result, there is no need to reserve space adjacent to the cell transistor or the cell capacitor for the metal routing. In addition, the arrangement of the word line structure, the bit line structure or the cell capacitor disposed over the substrate can be optimally adjusted due to the extra space.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A method of fabricating a semiconductor structure, comprising:
   providing a substrate having a first top surface;
   forming an isolation region in the substrate to surround an active region;
   forming a recess in the active region;
   disposing a first conductive material within the recess to form a buried power line and a buried signal line;
   forming a first circuit layer and a second circuit layer on the first top surface of the substrate, wherein the first circuit layer covers the buried power line and the buried signal line, and the second circuit layer is separated from the first circuit layer; and
   forming a cell capacitor over the first circuit layer.

2. The method according to claim 1, further comprising:
   forming a word line structure over the cell capacitor; and
   forming an interlayer dielectric to encapsulate the cell capacitor and the word line structure.

3. The method according to claim 2, wherein after the formation of the interlayer dielectric, a through hole is formed to penetrate the interlayer dielectric and partially expose the second circuit layer.

4. The method according to claim 3, wherein after the formation of the through hole, a second conductive material is deposited to fill the through hole.

5. The method according to claim 4, wherein after the formation of the second conductive material, a bit line structure is formed on the interlayer dielectric and over the word line structure.

6. The method according to claim 5, wherein the bit line structure is electrically coupled to the word line structure and the cell capacitor.

7. The method according to claim 5, wherein the bit line structure is electrically coupled to the word line structure, the cell capacitor and the first circuit layer.

8. The method according to claim 5, wherein the second conductive material electrically connects the bit line structure to the second circuit layer.

* * * * *